(12) United States Patent
Behzad

(10) Patent No.: US 8,416,883 B2
(45) Date of Patent: Apr. 9, 2013

(54) CONFIGURABLE LOAD IMPEDANCE FOR POWER AMPLIFIER PRE-DISTORTION CALIBRATION

(75) Inventor: Arya Reza Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/300,781

(22) Filed: Nov. 21, 2011

(65) Prior Publication Data

US 2012/0063495 A1     Mar. 15, 2012

Related U.S. Application Data

(63) Continuation of application No. 12/031,686, filed on Feb. 14, 2008, now Pat. No. 8,085,869.

(51) Int. Cl.
*H04L 25/49*     (2006.01)

(52) U.S. Cl.
USPC ........................................................ 375/297

(58) Field of Classification Search .................. 375/260, 375/267, 295–297; 455/101, 114.3, 115.1
See application file for complete search history.

(56) References Cited

U.S. PATENT DOCUMENTS

| 7,023,273 | B2 * | 4/2006 | Johnson et al. | 330/149 |
| 7,489,910 | B2 * | 2/2009 | Kato et al. | 455/101 |
| 7,751,784 | B2 * | 7/2010 | Ouzillou et al. | 455/115.1 |
| 7,894,546 | B2 * | 2/2011 | Magoon et al. | 375/296 |
| 8,150,335 | B2 * | 4/2012 | Waheed et al. | 455/114.3 |
| 8,150,336 | B2 * | 4/2012 | Waheed et al. | 455/114.3 |

OTHER PUBLICATIONS

Provisional U.S. Appl. No. 60/957,122.*

* cited by examiner

*Primary Examiner* — Khanh C Tran
(74) *Attorney, Agent, or Firm* — Garlick & Markison; Bruce E. Garlick

(57) ABSTRACT

An integrated circuit radio transceiver and method therefor includes an integrated circuit radio transceiver operable to provide specified gain levels and transmit path filter responses to correspond with a selected power spectral density mask. Changes in gain may be provided solely digital gain changes or may include analog gain module gain changes. A transmitter selects from one of at least three masks to reduce or eliminate spectral regrowth out of band to satisfy EVM requirements. Circuitry is provided to allow a transceiver to determine in advance what pre-distortion compensation settings are required for the various gain settings.

20 Claims, 17 Drawing Sheets

MIMO transceiver

FIG. 4  wireless transceiver transmit path 250

| Signal Shaping Scheme | Channel/Sub-Carriers |
|---|---|
| $S_1$ | $C_1$ |
| $S_2$ | $C_1$ |
| $S_3$ | $SC_1$ |
| $S_1$ | $C_1$ |
| $S_2$ | |
| $S_2$ | |
| $S_3$ | |
| $S_4$ | |
| $S_5$ | |
| $S_1$ | $SC_1\ SC_2\ SC_3\ SC_4$ |
| $S_2$ | $SC_1\ SC_2\ SC_3\ SC_4$ |
| $S_5$ | |

FIG. 6 exemplary Signal Shaping Scheme to Channel/Sub-Carrier Mapping Table 360

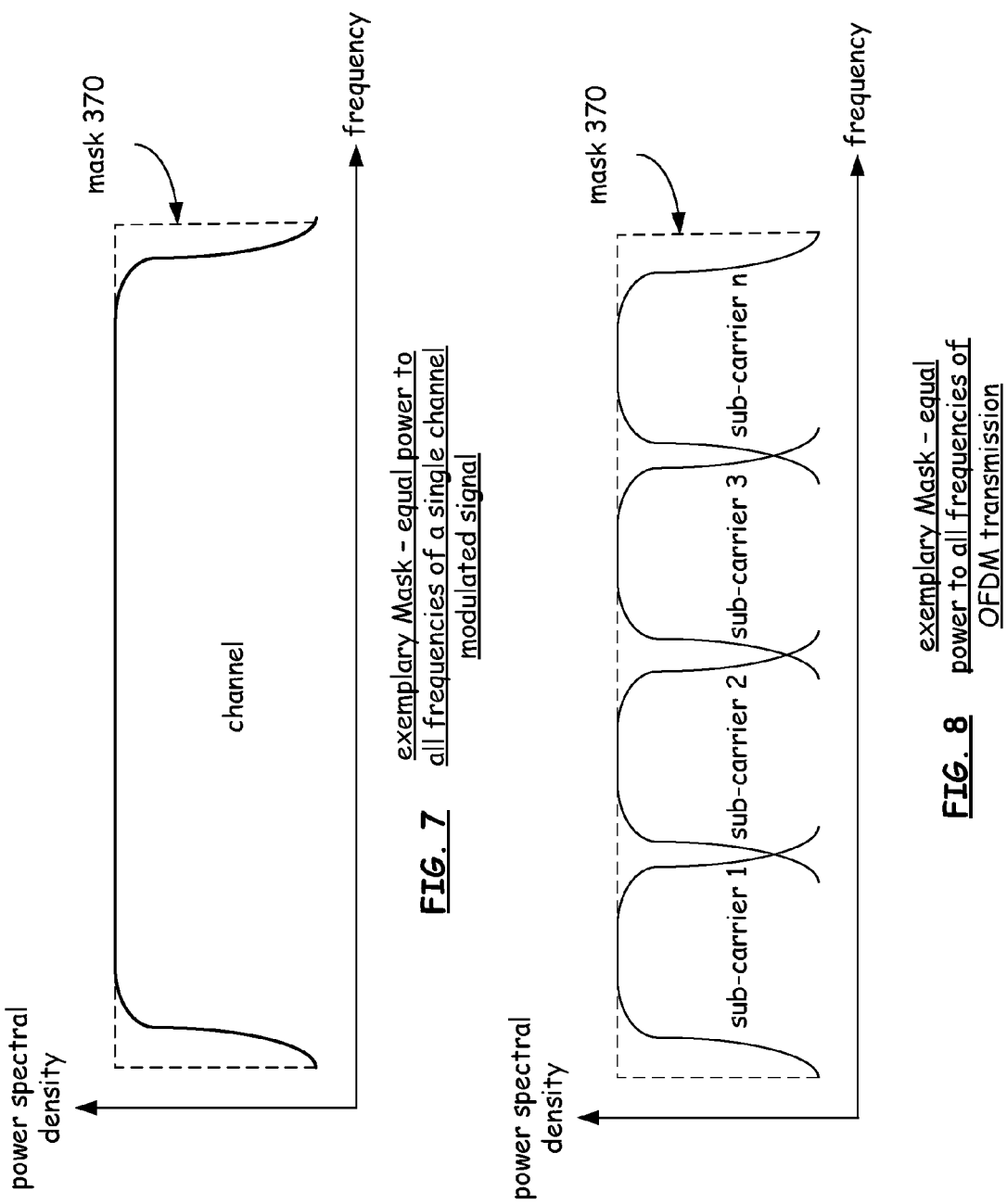

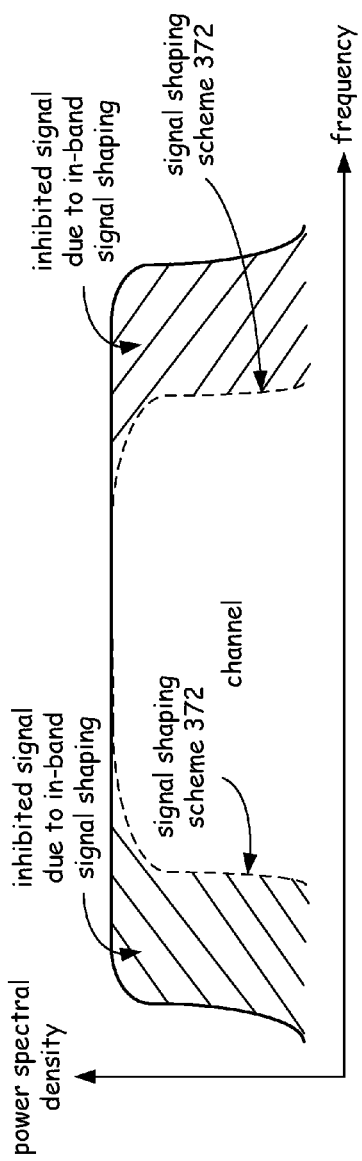
FIG. 11  exemplary Mask – substantially reduced power to outer frequencies of a single channel modulated signal
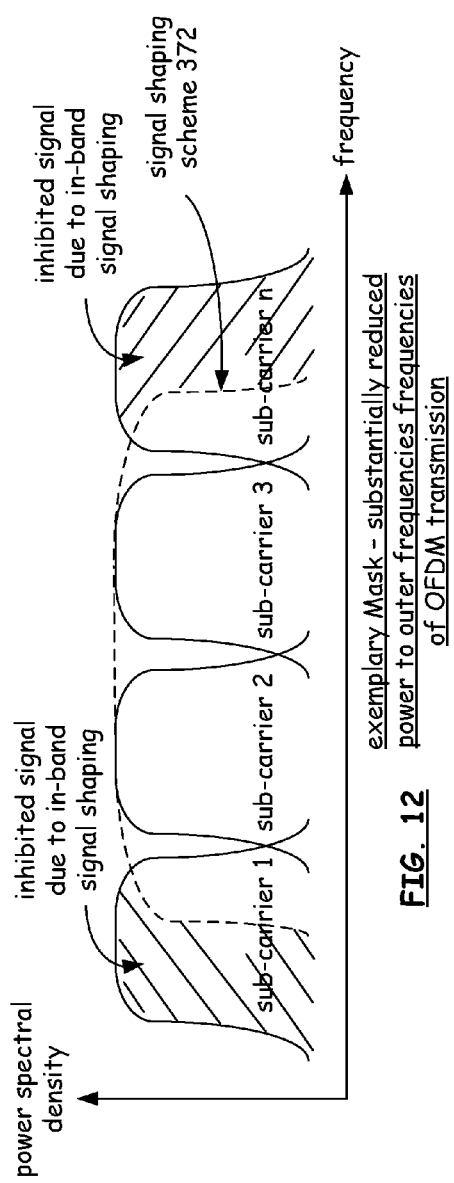
FIG. 12  exemplary Mask – substantially reduced power to outer frequencies frequencies of OFDM transmission

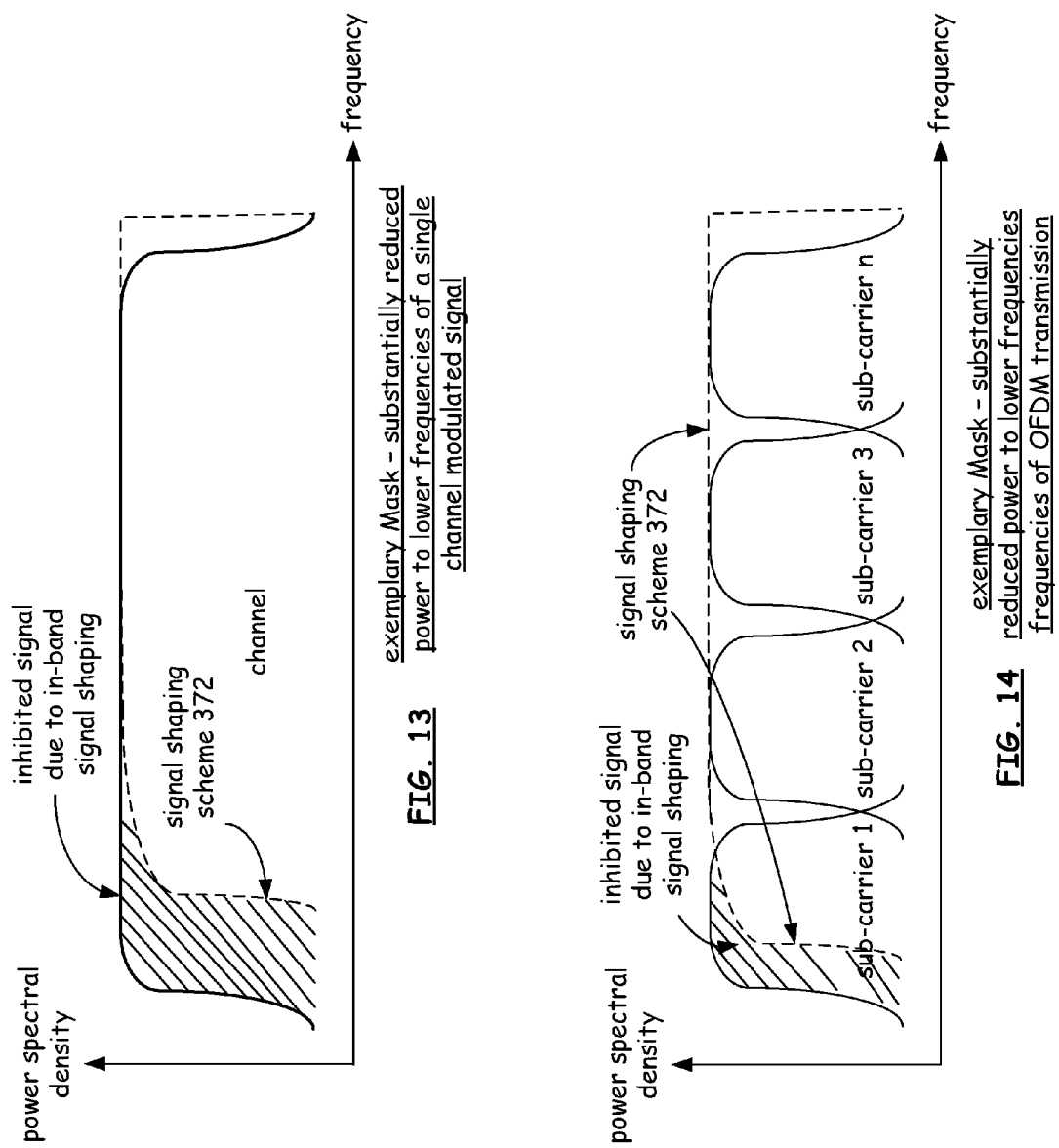

transmitter 500

FIG. 19 transceiver 650

CONFIGURABLE LOAD IMPEDANCE FOR POWER AMPLIFIER PRE-DISTORTION CALIBRATION

CROSS-REFERENCE TO PRIORITY APPLICATION

The present U.S. Utility patent application claims priority pursuant to 35 U.S.C. §120, as a continuation to U.S. Utility patent application Ser. No. 12/031,686, filed Feb. 14, 2008, entitled "Configurable Load Impedance for Power Amplifier Predistortion Calibration," pending, which is hereby incorporated herein by reference in its entirety and made part of the present U.S. Utility patent application for all purposes.

BACKGROUND

1. Technical Field

The present invention relates to wireless communications and, more particularly, to circuitry for wireless communications.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via a public switch telephone network (PSTN), via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier stage. The data modulation stage converts raw data into baseband signals in accordance with the particular wireless communication standard. The one or more intermediate frequency stages mix the baseband signals with one or more local oscillations to produce RF signals. The power amplifier stage amplifies the RF signals prior to transmission via an antenna.

Typically, the data modulation stage is implemented on a baseband processor chip, while the intermediate frequency (IF) stages and power amplifier stage are implemented on a separate radio processor chip. Historically, radio integrated circuits have been designed using bi-polar circuitry, allowing for large signal swings and linear transmitter component behavior. Therefore, many legacy baseband processors employ analog interfaces that communicate analog signals to and from the radio processor.

Typically, a digital processor produces outgoing digital signals that are converted to an analog form, amplified, filtered, and power amplified prior to transmission. One problem, though, is that the modules in an analog transmit path often create phase and or amplitude distortion that, in turn, introduces other anomalies such as spectral regrowth. It is known to provide pre-distortion compensation for a signal that is being conducted through the analog transmit path and then power amplified and transmitted. Such pre-distortion compensation does not always provide compensation that is optimal thus resulting in the anomalies including spectral regrowth.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which:

FIG. 6 is an exemplary table that illustrates a mapping between specified masks and carriers/sub-carriers according to one embodiment of the invention;

FIG. 7 is a signal diagram that illustrates an exemplary mask in relation to a single channel modulated signal according to one embodiment of the invention in which equal power is applied to the entire spectrum of the modulated signal;

FIG. 8 is a signal diagram that illustrates an exemplary mask in relation to a plurality of sub-carriers of a modulated signal according to one embodiment of the invention in which equal power is applied to the entire spectrum of the modulated signal;

FIG. 11 is a signal diagram that illustrates an exemplary mask in relation to a single channel modulated signal according to one embodiment of the invention in which no power is applied to the frequencies farthest from the center frequency of the modulated signal and the most power is applied to the frequencies proximate to the center frequency;

FIG. 12 is a signal diagram that illustrates an exemplary mask in relation to a plurality of sub-carriers of a modulated signal according to one embodiment of the invention in which no power is applied to the frequencies farthest from the center frequency of the modulated signal and the most power is applied to the frequencies proximate to the center frequency;

FIG. 13 is a signal diagram that illustrates an exemplary mask in relation to a single channel modulated signal according to one embodiment of the invention in which no power is applied to the frequencies farthest from the center frequency of the modulated signal at one end of the modulated signal spectrum and in which the PSD mask is non-symmetric;

FIG. 14 is a signal diagram that illustrates an exemplary mask in relation to a plurality of sub-carriers of a modulated signal according to one embodiment of the invention in which no power is applied to the frequencies farthest from the center frequency of the modulated signal at one end of the modulated signal spectrum and in which the PSD mask is non-symmetric;

DETAILED DESCRIPTION OF THE DRAWINGS

Figure 1:
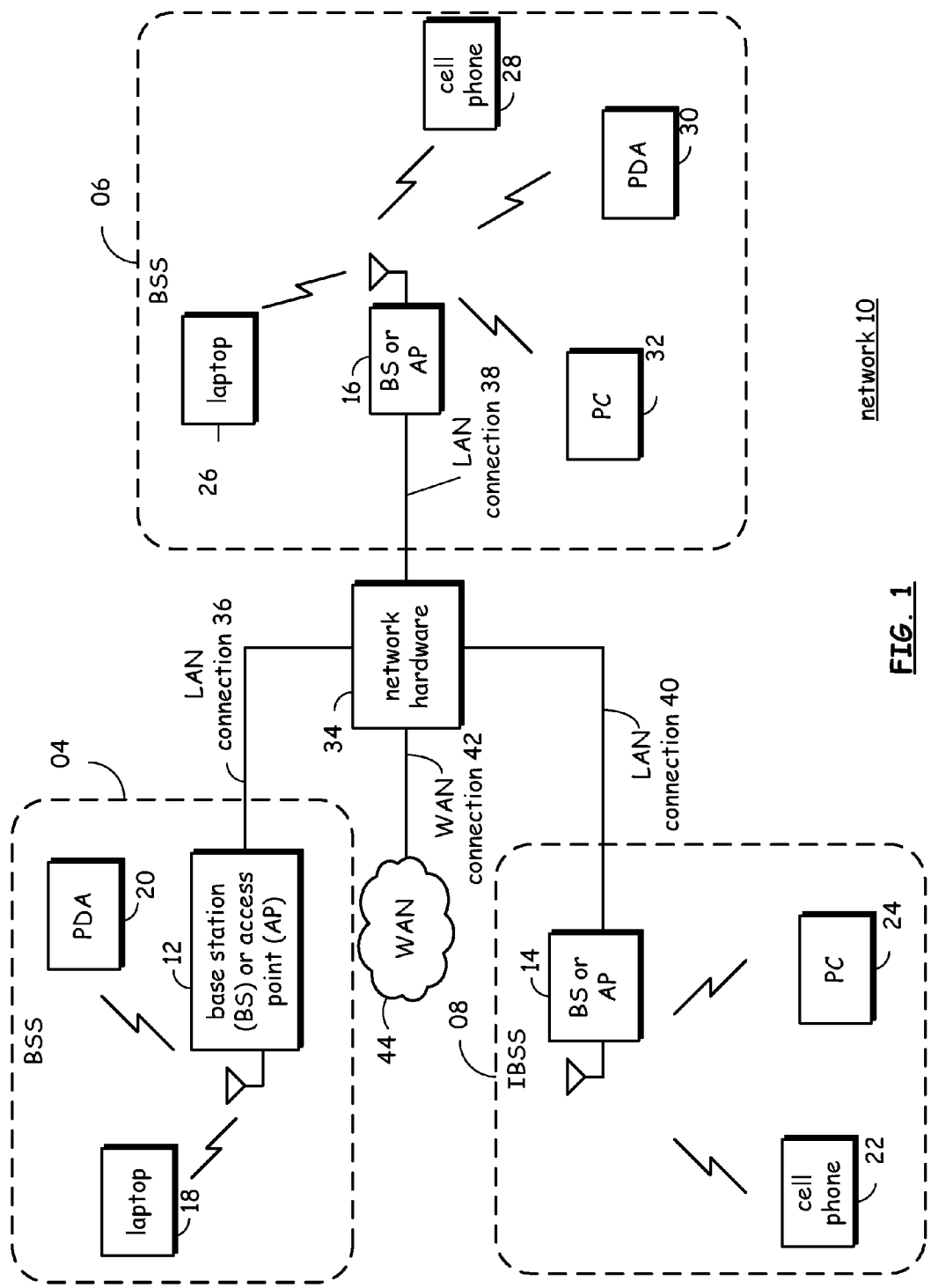
FIG. 1 is a schematic block diagram illustrating a wireless communication device that includes a host device and an associated radio.

FIG. 1 is a functional block diagram illustrating a communication system that includes circuit devices and network elements and operation thereof according to one embodiment of the invention. More specifically, a plurality of network service areas 04, 06 and 08 are a part of a network 10. Network 10 includes a plurality of base stations or access points (APs) 12-16, a plurality of wireless communication devices 18-32 and a network hardware component 34. The wireless communication devices 18-32 may be laptop computers 18 and 26, personal digital assistants 20 and 30, personal computers 24 and 32 and/or cellular telephones 22 and 28. The details of the wireless communication devices will be described in greater detail with reference to FIGS. 2-10.

The base stations or APs 12-16 are operably coupled to the network hardware component 34 via local area network (LAN) connections 36, 38 and 40. The network hardware component 34, which may be a router, switch, bridge, modem, system controller, etc., provides a wide area network (WAN) connection 42 for the communication system 10 to an external network element such as WAN 44. Each of the base stations or access points 12-16 has an associated antenna or antenna array to communicate with the wireless communication devices in its area. Typically, the wireless communication devices 18-32 register with the particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. Each of the radios may be formed according to one or more standards or protocols including, for example, I.E.E.E. 802.11(a), (b), (g), or (n). Further one or more of the radios includes circuitry operable to employ the teachings of one or more embodiments of the invention.

Figure 2:
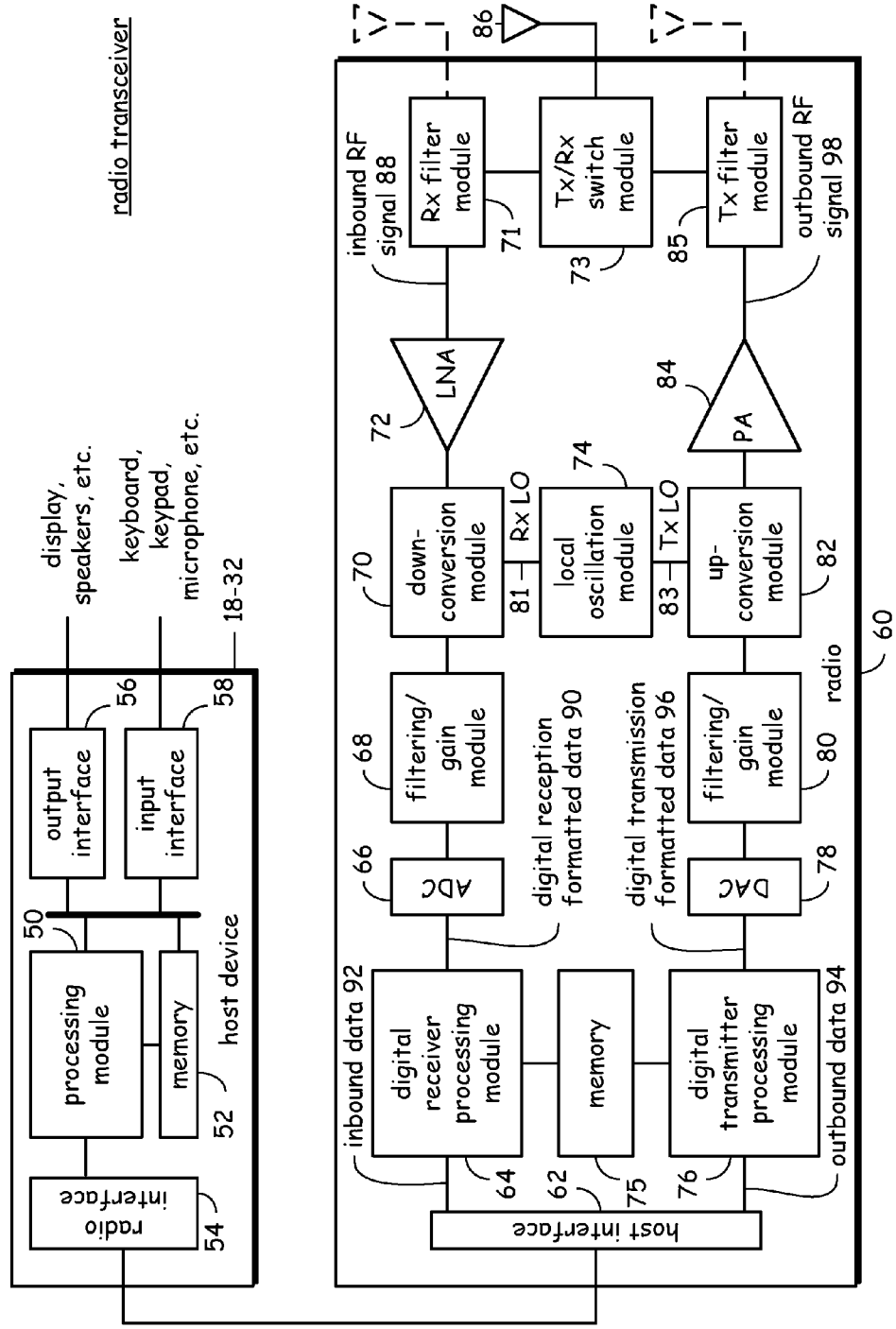
FIG. 2 is a schematic block diagram illustrating a wireless communication host device and an associated radio.

FIG. 2 is a schematic block diagram illustrating a wireless communication host device 18-32 and an associated radio 60. For cellular telephone hosts, radio 60 is a built-in component. For personal digital assistants hosts, laptop hosts, and/or personal computer hosts, the radio 60 may be built-in or an externally coupled component.

As illustrated, wireless communication host device 18-32 includes a processing module 50, a memory 52, a radio interface 54, an input interface 58 and an output interface 56. Processing module 50 and memory 52 execute the corresponding instructions that are typically done by the host device. For example, for a cellular telephone host device, processing module 50 performs the corresponding communication functions in accordance with a particular cellular telephone standard.

Radio interface 54 allows data to be received from and sent to radio 60. For data received from radio 60 (e.g., inbound data), radio interface 54 provides the data to processing module 50 for further processing and/or routing to output interface 56. Output interface 56 provides connectivity to an output device such as a display, monitor, speakers, etc., such that the received data may be displayed. Radio interface 54 also provides data from processing module 50 to radio 60. Processing module 50 may receive the outbound data from an input device such as a keyboard, keypad, microphone, etc., via input interface 58 or generate the data itself. For data received via input interface 58, processing module 50 may perform a corresponding host function on the data and/or route it to radio 60 via radio interface 54.

Radio 60 includes a host interface 62, a digital receiver processing module 64, an analog-to-digital converter 66, a filtering/gain module 68, a down-conversion module 70, a low noise amplifier 72, a receiver filter module 71, a transmitter/receiver (Tx/Rx) switch module 73, a local oscillation module 74, a memory 75, a digital transmitter processing module 76, a digital-to-analog converter 78, a filtering/gain module 80, an up-conversion module 82, a power amplifier 84, a transmitter filter module 85, and an antenna 86 operatively coupled as shown. The antenna 86 is shared by the transmit and receive paths as regulated by the Tx/Rx switch module 73. The antenna implementation will depend on the particular standard to which the wireless communication device is compliant.

Digital receiver processing module 64 and digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, and modulation. Digital receiver and transmitter processing modules 64 and 76, respectively, may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 75 may be a single memory device or a plurality of memory devices. Such a memory device may be a read-only memory, random access memory, volatile memory, non-volatile memory, static memory, dynamic memory, flash memory, and/or any device that stores digital information. Note that when digital receiver processing module 64 and/or digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. Memory 75 stores, and digital receiver processing module 64 and/or digital transmitter processing module 76 executes, operational instructions corresponding to at least some of the functions illustrated herein.

In operation, radio 60 receives outbound data 94 from wireless communication host device 18-32 via host interface 62. Host interface 62 routes outbound data 94 to digital transmitter processing module 76, which processes outbound data 94 in accordance with a particular wireless communication standard or protocol (e.g., IEEE 802.11(a), IEEE 802.11b, Bluetooth, etc.) to produce digital transmission formatted data 96. Digital transmission formatted data 96 will be a digital baseband signal or a digital low IF signal, where the low IF typically will be in the frequency range of one hundred kilohertz to a few megahertz.

Digital-to-analog converter 78 converts digital transmission formatted data 96 from the digital domain to the analog domain. Filtering/gain module 80 filters and/or adjusts the gain of the analog baseband signal prior to providing it to up-conversion module 82. Up-conversion module 82 directly converts the analog baseband signal, or low IF signal, into an RF signal based on a transmitter local oscillation 83 provided by local oscillation module 74. Power amplifier 84 amplifies the RF signal to produce an outbound RF signal 98, which is filtered by transmitter filter module 85. The antenna 86 transmits outbound RF signal 98 to a targeted device such as a base station, an access point, and/or another wireless communication device.

Radio 60 also receives an inbound RF signal 88 via antenna 86, which was transmitted by a base station, an access point, or another wireless communication device. The antenna 86 provides inbound RF signal 88 to receiver filter module 71 via Tx/Rx switch module 73, where Rx filter module 71 band pass filters inbound RF signal 88. The Rx filter module 71 provides the filtered RF signal to low noise amplifier 72, which amplifies inbound RF signal 88 to produce an amplified inbound RF signal. Low noise amplifier 72 provides the amplified inbound RF signal to down-conversion module 70, which directly converts the amplified inbound RF signal into an inbound low IF signal or baseband signal based on a receiver local oscillation 81 provided by local oscillation module 74. Down-conversion module 70 provides the inbound low IF signal or baseband signal to filtering/gain module 68. Filtering/gain module 68 may be implemented in accordance with the teachings of the present invention to filter and/or attenuate the inbound low IF signal or the inbound baseband signal to produce a filtered inbound signal.

Analog-to-digital converter 66 converts the filtered inbound signal from the analog domain to the digital domain to produce digital reception formatted data 90. Digital receiver processing module 64 decodes, descrambles, demaps, and/or demodulates digital reception formatted data 90 to recapture inbound data 92 in accordance with the particular wireless communication standard being implemented by radio 60. Host interface 62 provides the recaptured inbound data 92 to the wireless communication host device 18-32 via radio interface 54.

As one of average skill in the art will appreciate, the wireless communication device of FIG. 2 may be implemented using one or more integrated circuits. For example, the host device may be implemented on a first integrated circuit, while digital receiver processing module 64, digital transmitter processing module 76 and memory 75 may be implemented on a second integrated circuit, and the remaining components of radio 60, less antenna 86, may be implemented on a third integrated circuit. As an alternate example, radio 60 may be implemented on a single integrated circuit. As yet another example, processing module 50 of the host device and digital receiver processing module 64 and digital transmitter processing module 76 may be a common processing device implemented on a single integrated circuit.

Memory 52 and memory 75 may be implemented on a single integrated circuit and/or on the same integrated circuit as the common processing modules of processing module 50, digital receiver processing module 64, and digital transmitter processing module 76. As will be described, it is important that accurate oscillation signals are provided to mixers and conversion modules. A source of oscillation error is noise coupled into oscillation circuitry through integrated circuitry biasing circuitry. One embodiment of the present invention reduces the noise by providing a selectable pole low pass filter in current minor devices formed within the one or more integrated circuits.

Local oscillation module 74 includes circuitry for adjusting an output frequency of a local oscillation signal provided from module 74. Local oscillation module 74 receives a frequency correction input that it uses to adjust an output local oscillation signal to produce a frequency corrected local oscillation signal output. While local oscillation module 74, up-conversion module 82, and down-conversion module 70 are implemented to perform direct conversion between baseband and RF, it is understood that the principles herein may also be applied readily to systems that implement an intermediate frequency conversion step at a low intermediate frequency.

Figure 3:
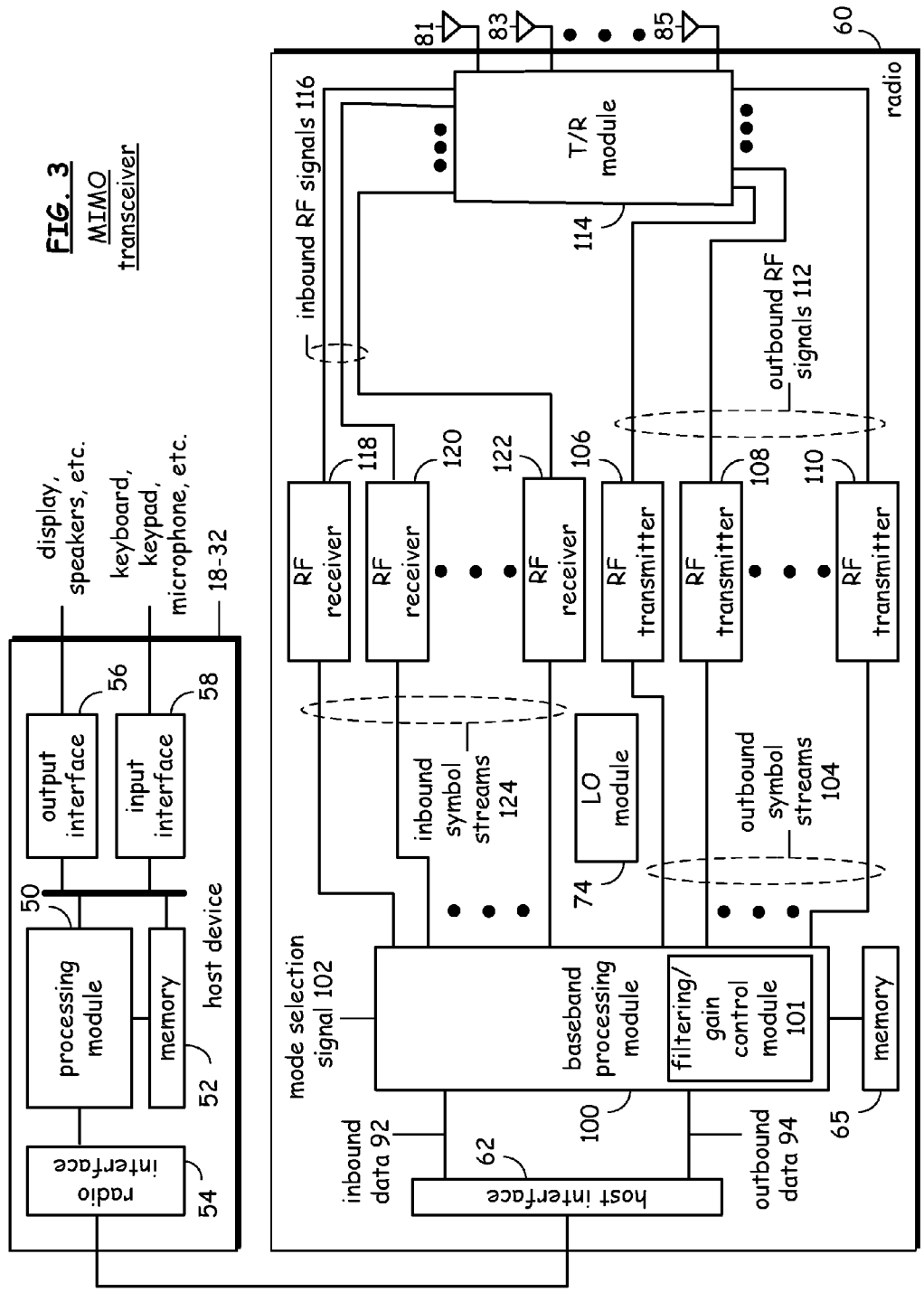
FIG. 3 is a schematic block diagram illustrating a wireless communication device that includes the host device and an associated radio in an alternate embodiment.

FIG. 3 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58, and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, etc., such that the received data may be displayed. The radio interface 54 also provides data from the processing module 50 to the radio 60. The processing module 50 may receive the outbound data from an input device such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a baseband processing module 100, memory 65, a plurality of radio frequency (RF) transmitters 106-110, a transmit/receive (T/R) module 114, a plurality of antennas 81-85, a plurality of RF receivers 118-120, and a local oscillation module 74. The baseband processing module 100, in combination with operational instructions stored in memory 65, executes digital receiver functions and digital transmitter functions, respectively. Moreover, baseband processing module 100 further includes, in the described embodiment, a filtering/gain control module 101. Filtering/gain control module 101 is operable, in one embodiment, to define power spectral density masks that have specified shapes for power and gain across the bandwidth channel for different modulation schemes including orthogonal frequency division multiplexing (OFDM).

The digital receiver functions include, but are not limited to, digital intermediate frequency to baseband conversion, demodulation, constellation demapping, decoding, de-interleaving, fast Fourier transform, cyclic prefix removal, space and time decoding, and/or descrambling. The digital transmitter functions include, but are not limited to, scrambling, encoding, interleaving, constellation mapping, modulation, inverse fast Fourier transform, cyclic prefix addition, space and time encoding, and digital baseband to IF conversion. The baseband processing module 100 may be implemented using one or more processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 65 may be a single memory device or a plurality of memory devices. Such a memory device may be a read-only memory, random access memory, volatile memory, non-volatile memory, static memory, dynamic memory, flash memory, and/or any device that stores digital information. Note that when the baseband processing module 100 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The baseband processing module 100 receives the outbound data 94 and, based on a mode selection signal 102, produces one or more outbound symbol streams 104. The mode selection signal 102 will indicate a particular mode of operation that is compliant with one or more specific modes of the various IEEE 802.11 standards. For example, the mode selection signal 102 may indicate a frequency band of 2.4 GHz, a channel bandwidth of 20 or 22 MHz and a maximum bit rate of 54 megabits-per-second. In this general category, the mode selection signal will further indicate a particular rate ranging from 1 megabit-per-second to 54 megabits-per-second. In addition, the mode selection signal will indicate a particular type of modulation, which includes, but is not limited to, Barker Code Modulation, BPSK, QPSK, CCK, 16 QAM, and/or 64 QAM. The mode selection signal 102 may also include a code rate, a number of coded bits per subcarrier (NBPSC), coded bits per OFDM symbol (NCBPS), and/or data bits per OFDM symbol (NDBPS). The mode selection signal 102 may also indicate a particular channelization for the corresponding mode that provides a channel number and corresponding center frequency. The mode selection signal 102 may further indicate a power spectral density mask value and a number of antennas to be initially used for a MIMO communication.

The baseband processing module 100, based on the mode selection signal 102 produces one or more outbound symbol streams 104 from the outbound data 94. For example, if the mode selection signal 102 indicates that a single transmit antenna is being utilized for the particular mode that has been selected, the baseband processing module 100 will produce a single outbound symbol stream 104. Alternatively, if the mode selection signal 102 indicates 2, 3, or 4 antennas, the baseband processing module 100 will produce 2, 3, or 4 outbound symbol streams 104 from the outbound data 94.

Depending on the number of outbound symbol streams 104 produced by the baseband processing module 100, a corresponding number of the RF transmitters 106-110 will be enabled to convert the outbound symbol streams 104 into outbound RF signals 112. In general, each of the RF transmitters 106-110 includes a digital filter and upsampling module, a digital-to-analog conversion module, an analog filter module, a frequency up conversion module, a power amplifier, and a radio frequency band pass filter. The RF transmitters 106-110 provide the outbound RF signals 112 to the transmit/receive module 114, which provides each outbound RF signal to a corresponding antenna 81-85.

When the radio 60 is in the receive mode, the transmit/receive module 114 receives one or more inbound RF signals 116 via the antennas 81-85 and provides them to one or more RF receivers 118-122. The RF receiver 118-122 converts the inbound RF signals 116 into a corresponding number of inbound symbol streams 124. The number of inbound symbol streams 124 will correspond to the particular mode in which the data was received. The baseband processing module 100 converts the inbound symbol streams 124 into inbound data 92, which is provided to the host device 18-32 via the host interface 62.

As one of average skill in the art will appreciate, the wireless communication device of FIG. 3 may be implemented using one or more integrated circuits. For example, the host device may be implemented on a first integrated circuit, the baseband processing module 100 and memory 65 may be implemented on a second integrated circuit, and the remaining components of the radio 60, less the antennas 81-85, may be implemented on a third integrated circuit. As an alternate example, the radio 60 may be implemented on a single integrated circuit. As yet another example, the processing module 50 of the host device and the baseband processing module 100 may be a common processing device implemented on a single integrated circuit. Further, the memory 52 and memory 65 may be implemented on a single integrated circuit and/or on the same integrated circuit as the common processing modules of processing module 50 and the baseband processing module 100.

Finally, is should be mentioned that digital processing module 76 of FIG. 2 and baseband processing module 100 of FIG. 3 are, in embodiment, of the invention, operable to provide pre-distortion compensation based upon an analog transmit path gain to provide optimal compensation as gain levels of the analog transmit path are changed based upon operational demands and/or conditions. The radio transceivers of FIGS. 2 and 3 and the circuitry and methods described below may further be implemented within the wireless transceivers of the network of FIG. 1.

Figure 4:
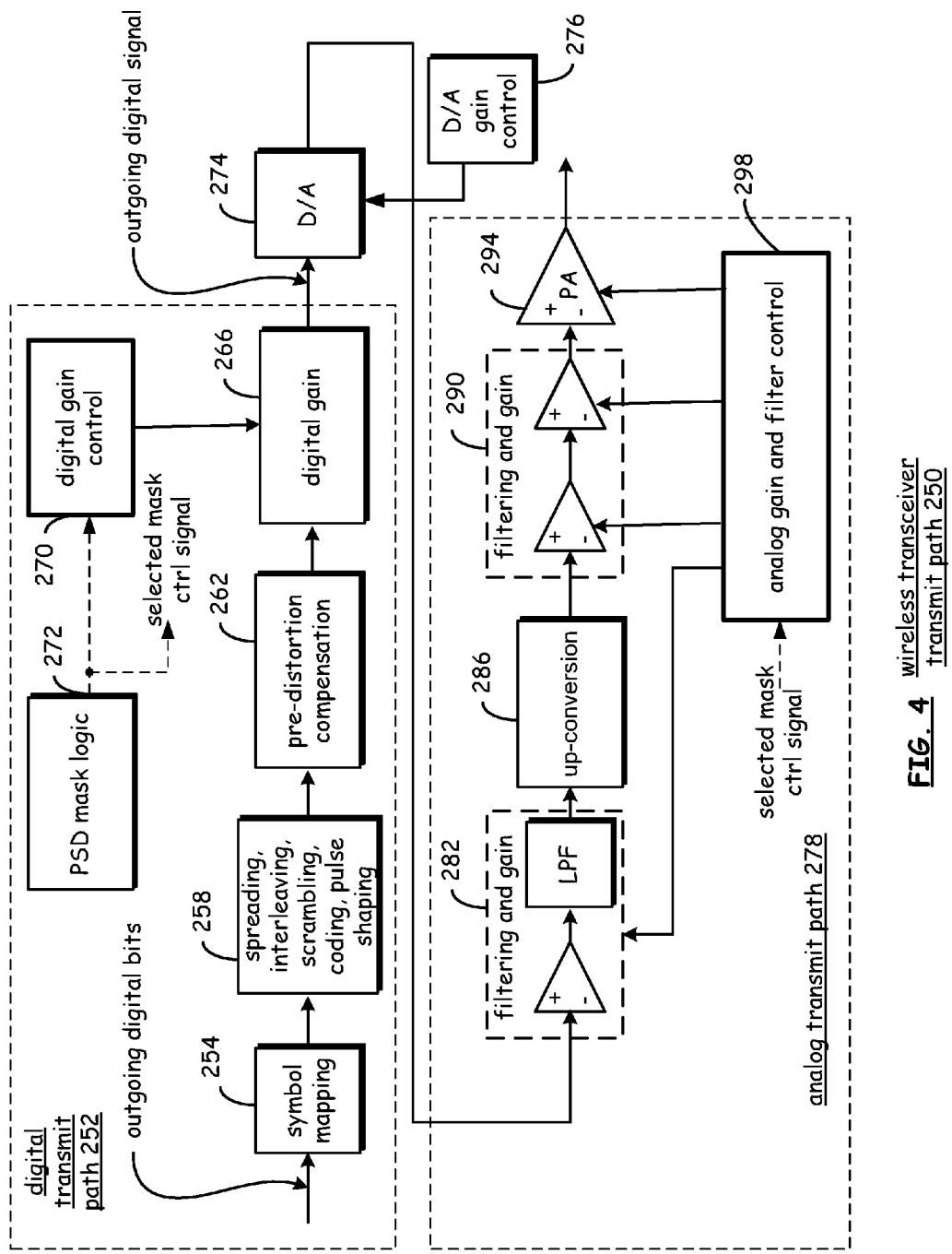
FIG. 4 is a functional block diagram of a wireless transceiver transmit path according to one embodiment of the invention.

FIG. 4 is a functional block diagram of a wireless transceiver transmit path 250 according to one embodiment of the invention. Though not specifically shown here, a baseband or other digital processor typically produces outgoing digital data that is received and processed by a plurality of known digital processing blocks or modules (collectively, a digital transmit path 252) that includes modules such as symbol mapping module 254, one or more modules 258 that collectively perform spreading, interleaving, scrambling, coding and pulse shaping and a pre-distortion compensation module 262. It should be understood that modules of the digital transmit path of the comprise digital functionality that perform one or more specified functions to create a digital signal that eventually is converted to a traditional analog signal form for processing and transmission from a transmit path. Moreover, the modules and functionality listed for the digital transmit path 252 are exemplary and may be changed according to specific design requirements. Specifically, for example, some of the functionality may be removed or other functionality, such as up-sampling modules and decimation modules to modify a sample rate of the digital data may be included.

Pre-distortion compensation module 262 is operable to introduce phase and/or magnitude compensation to a received digital signal to compensate for downstream analog transmit path distortion. In the embodiment of FIG. 4, pre-distortion compensation module 262 is operable to provide a plurality of compensation settings (or pre-distortion curves) based upon a corresponding plurality of gain settings within the analog transmit path. Generally, a pre-distortion curve is determined for each analog transmit path gain setting. The pre-distortion curves thus define the pre-distortion gain settings that are applied to a digital signal to pre-compensate for downstream distortion that will be introduced in the analog transmit path.

Additionally, a digital gain module 266 typically provides a specified amount of digital gain to the outgoing digital signals. Here, digital gain module 266 produces a digital gain based upon a received digital gain control signal produced by digital gain control 270 that includes logic for adjusting the digital gain as will be described in greater detail below. The outgoing digital signal produced by digital gain module 266 is then produced to a digital-to-analog conversion module 274. As may be seen, digital-to-analog conversion module 274 is also coupled to receive a gain control signal from a digital-to-analog gain control module 276. Digital-to-analog gain control module 276 is operable to adjust a gain of digital-to-analog conversion module 274 which is therefore operable to produce an outgoing analog baseband or intermediate frequency band signal for processing to and by an analog transmit path 278 having an adjustable gain level. While these gain settings technically are in the analog transmit path, they are treated separately from all other gain settings in the analog transmit path because digital-to-analog conversion module 274 effectively adjusts the gain of the input digital signal and therefore does not affect the analog transmit path distortion levels or linearity. Accordingly, references herein to adjust a digital gain specifically include adjusting the gain of digital-to-analog conversion module 274.

Analog transmit path 278 includes filtering and gain module 282, upconversion module 286, filtering and gain module 290 and power amplifier 294. In the described embodiment, filtering and gain module 282, filtering and gain module 290 and power amplifier 294 are each operably disposed to receive gain control signals from analog gain control module 298. Moreover, the modules may comprise a plurality of modules. For example, in one embodiment, filtering and gain module 290 may comprise a plurality of high-pass variable gain amplifiers that provide amplification and high-pass filtering for an outgoing radio frequency signal that has already be upconverted from a baseband frequency signal or from an intermediate frequency signal. Analog gain control 298 is therefore operable to provide at least one of gain control and filter control to a plurality of filtering and gain control modules in the analog transmit path 278.

As may also be seen, the transmit path of the transceiver of FIG. 4 further includes a signal shaping logic module 272 which is operable to select and produce an indication of a selected signal shaping scheme. The indication or control information is produced to prompt the various digital and analog gain and filtering elements of the transmit path to produce a gain/power or filter response that corresponds to the selected signal shaping scheme. In the embodiment of FIG. 4, the selected signal shaping scheme is produced to digital control module 270 of digital transmit path 252 and to analog gain and filter control module 298 of analog transmit path 278. Based on the received selected mask control signal, analog gain and filter control module 298 modifies gain or signal magnitudes of one or more gain elements in the analog transmit path 278 as well as modifying filter response shaping of one or more filters.

In the described embodiment of the invention, the filters, especially the low pass filter(s), of the analog transmit path 278 have selectable filter responses to support a plurality of filter responses for a desired signal frequency spectrum or range. Moreover, high frequency filtering is performed by filtering and gain module 290 while low frequency filtering is performed by filtering and gain module 282. As such, in the embodiment of FIG. 4, analog gain and filter control module 298 is operable to produce a non-symmetric shaped signal response by separately controlling low frequency and high frequency gain as well as filtering. Analog gain control 298 is operable to provide at least one of gain control and filter control to a plurality of filtering and gain control modules in the analog transmit path 278. In general, analog gain control 298 is operable to generate control signal to support signal shaping for modules in which such signal shaping may be performed without introducing additional non-linearity or other problems with the outgoing signal. For example, while analog gain control 298 is operable to provide gain level setting to each gain module or element of the analog transmit path 278, analog gain control 298 may only provide control signals to filter and gain elements prior to the power amplifier of the analog transmit path 278. For example, signal shaping control commands may be sent to only one of filtering and gain module 282 and 290 or to both but not to power amplifier 294. With respect to FIG. 5, which is discussed in greater detail below, signal shaping control commands are not sent to power amplification module 336 but can be sent to at least one of filter and gain modules 308 and 324.

One aspect of the embodiments of the invention is the use of selected signal shaping schemes to satisfy error-vector magnitude (EVM) requirements for a given signal type. Depending on the signal type and even transmission channel, spectral re-growth may violate EVM requirements. Accordingly, the embodiments of the present invention select signal shaping schemes to define power spectral density requirements that account for the transmission signal type (and associated spectral flatness requirements, EVM requirements generally associated for a specific transmission signal type (e.g., 802.11(a), (b) or (g)). Additionally, for some signal types, based in part upon assigned signal frequency range, a selected channel for the signal may have additional EVM requirements to avoid spectral regrowth within restricted bands. Accordingly, signal magnitude, digital and analog gain, and pre-distortion compensation settings are potentially limited by a selected signal shaping scheme that is used to satisfy signal flatness and EVM requirements whether the signal is a single carrier signal or multiple carrier OFDM signal.

One aspect of the embodiments of the invention includes reducing the gain/power at the frequencies farthest from a center frequency of a modulated signal to the extent allowed by a transmission standard or protocol corresponding to a signal transmission (hereinafter "signal type"). Reducing the gain/power at the ends of the modulated signal spectrum (whether a single channel or a plurality of channels for and OFDM modulated signals) reduces out of band spectral regrowth and potential violation of EVM requirements.

In operation, digital gain control module 270, digital-to-analog gain control module 276 and analog gain and filter control module 298 collectively define a total gain of a signal being wirelessly transmitted from an antenna operably disposed to receive the output of power amplifier 294. This total gain is based, at least in part, on the selected signal shaping scheme. Pre-distortion compensation module 262, however, produces a pre-compensation adjustment to an outgoing digital signal based upon a specified analog transmit path gain level of one or more gain levels specified by analog gain and filter control 298. The references herein to "specified gain levels" for the analog transmit path refer to analog transmit path gain settings for which a specific pre-distortion compensation setting is generated by pre-distortion compensation module 262.

In a preferred embodiment, the specified gain levels of the analog transmit path are discrete gain settings with a constant step size. In an alternate and equivalent embodiment, however, pre-distortion settings are defined for analog transmit path gain settings that fall within a specified range. One aspect of the embodiments of the present invention is that digital gain control 270 is operable to provide digital gain adjustments to supplement a current analog transmit path gain to provide a desired total gain. Thus, if a new total desired gain is one that can be achieved by changing only the digital gain, then only the digital gain is changed and a current pre-distortion compensation setting is not modified to maintain effectiveness.

Typically, however, a limit is specified for total digital gain changes because of performance limitations of the digital to analog conversion module 274. Thus, if the gain adjustment exceeds a maximum value allowed, the gain of the analog transmit path 278 is changed to be proximate to the desired total gain (within a tolerance or range) and then the digital gain is adjusted to provide the desired total gain.

One aspect of the embodiments of the invention is that the pre-distortion compensation module 262 is operable to produce a plurality of pre-distortion curves that define pre-distortion settings that correspond to a corresponding plurality of specified gain levels of the analog transmit path 278. Alternatively, the pre-distortion settings correspond to gain settings of a subset of the analog gain modules in the transmit path. In one specific embodiment, the pre-distortion compensation settings correspond to gain settings of one specific module in analog transmit path 278. For example, a plurality of pre-distortion settings may be defined for a corresponding plurality of gain settings of power amplifier 274. This embodiment is advantageous in that power from the power amplifier is not wasted for lower gain settings. In contrast, many prior art systems keep the power amplifier at a high or maximum power level while modifying other gain modules in the transmit path since changing the power amplifier gain level is most likely to render the single pre-distortion setting less effective.

One additional aspect of the embodiment of FIG. 4 is that the system is operable to make digital gain adjustments by changing the digital gain within digital transmit path 252 and the gain of digital-to-analog conversion module 274. If a gain change is required by either the power amplifier 294 or any other module in the analog transmit path 278, however, the gain is changed by a specified gain amount or step that has an associated pre-distortion curve. As such, new pre-distortion settings (based on pre-distortion curve) correspond to the change in the analog transmit path. Thereafter, the digital gain is adjusted to supplement the analog transmit path gain, if necessary, to produce the total amount of desired gain.

It should be understood that the transmit path of FIG. 4 is an exemplary transmit path. A radio transceiver formed according on one embodiment of the invention may include a plurality of transmit paths for a multiple in multiple out (MIMO) type radio transceiver. Some or even all of the modules of FIG. 4 may be duplicated for each transmit path according to design implementation. Such a MIMO transceiver may, for example, each transmit one or more sub-carriers of a given OFDM signal. Each of the filtering and gain modules 282 and 290, as well as digital gain control 270 and digital-to-analog gain control module 276, may jointly be represented as module 101 of FIG. 3, and may operate to support a defined shaped signal response.

Figure 5:
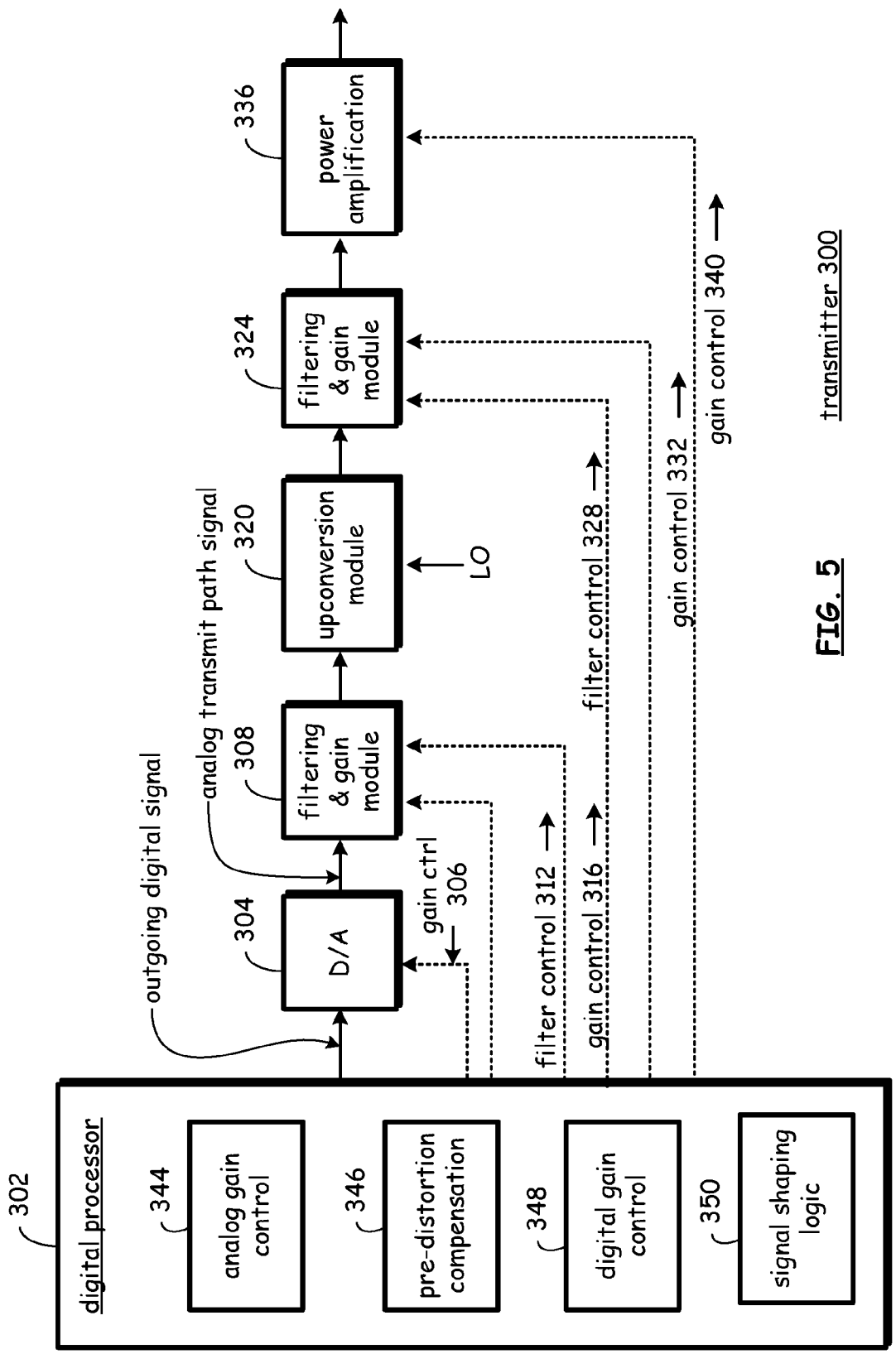
FIG. 5 is a functional block diagram of a wireless transmitter operable to provide gain based compensation and desired filter responses to correspond to a selected PSD mask according to one embodiment of the invention.

FIG. 5 is a functional block diagram of a wireless transmitter operable to provide gain based compensation according to one embodiment of the invention. As may be seen, a digital processor 302 is operably disposed to produce an outgoing digital signal to a digital to analog converter 304 which then produces an analog transmit path signal based on the outgoing digital signal to a filtering and gain module 308. Filtering and gain module 308 then produces an amplified and filtered analog transmit path signal at one of a baseband or intermediate frequency.

The output of filtering and gain module 308 is based upon the received analog transmit path signal as well as a filter control signal 312 and a gain control signal 316 received from logic or, as shown here, from digital processor 302. The output of filtering and gain module 308 is then produced to an up-conversion module 320 that is operable to produce an up-converted radio frequency signal. The up-converted radio frequency signal is then produced to filtering and gain module 324. Filtering and gain module 324 then produces and an outgoing amplified and filtered radio frequency signal based on the up-converted radio frequency signal and also based upon a filter control signal 328 and a gain control signal 332 to power amplification module 336. Power amplification module then amplifies the outgoing amplified and filtered radio frequency signal based upon a gain control signal 340.

As may be further seen, digital processor 302 further includes analog gain control module 344 operable to specify analog transmit path gain module gain settings, pre-distortion compensation module 346 operable to set pre-distortion compensation settings based upon (corresponding to) the analog transmit path gain module gain settings and digital gain control signal 348, and digital gain control module 348 operable to specify digital gain settings. As may also be seen, digital processor 302 produces gain control signals 306 to digital-to-analog conversion module 304. These gain level settings are treated as being digital gain level changes since, in one embodiment, the gain of the input signal to conversion module 304 is effectively adjusted prior to conversion to an analog form. As such, these adjustments do not affect distortion that is introduced in the transmit path. These gain control settings 306 may be determined either by analog gain control module 344 or by digital gain control 348. In the described embodiment, they are determined by digital gain control 348 since, effectively, they are similar to digital gain adjustments in that they do not affect the analog transmit path distortion.

Additionally, digital processor 302 further includes signal shaping logic 350 that is operable to support in band signal shaping to satisfy out of band power spectral mask requirements. Signal shaping logic is operable to communicate with digital gain control module 348 and analog gain control module 344 to provide signal shaping information. This signal shaping information may be in any form including an identification of selected PSD mask information for one or more PSD masks to enable gain control modules 344 and 348 to make corresponding gain level determinations to provide signal shaping that corresponds to the PSD mask information. Accordingly, analog gain control module 344 generates gain control signals 332 and 340 based in part on the digital gain setting and to correspond to a power spectral density of the one or more PSD masks in addition to filter control signals 312 and 328 to filter and gain modules 308 and 324 to define an overall PSD mask that produces a desired power spectral density.

It should be understood that the transmit path of FIG. 5 is an exemplary transmit path. A radio transceiver formed according on one embodiment of the invention may include a plurality of transmit paths for a multiple in multiple out (MIMO) type radio transceiver. Some or even all of the modules of FIG. 5 may be duplicated for each transmit path according to design implementation. Such a MIMO transceiver may, for example, each transmit one or more sub-carriers of a given OFDM signal. Each of the filtering and gain modules 308 and 324, as well as digital gain control 348, provide in band signal shaping similar to filtering and gain control module 101 of FIG. 3, as necessary, to satisfy a defined power spectral density (PSD) mask.

In operation, digital processor 302, and more particularly, analog gain control module 344 generates gain control signals 316, 332 and 340 to control analog transmit path gain. It should be understood that more or less numbers of gain modules and control lines may be included in a transmit path. Digital processor 302 also generates filter control signals 312 and 328 to define response time and pole location of the various filters in the analog transmit path. Additionally, digital gain control module 348 adjusts a digital gain of the outgoing digital signal according to a desired total transmit path gain. Finally, pre-distortion compensation 346 produces pre-distortion settings to superimpose on or apply to the outgoing digital signal. Specific operation of the logic for the pre-distortion compensation and the analog and digital control is similar to that described above in relation to FIG. 4 as well as will be described in the discussion of the figures that follow. In general, however, pre-distortion compensation provides a plurality of pre-distortion curves that define pre-distortion settings, for a corresponding plurality of analog transmit path gain settings.

In one embodiment, the pre-distortion curves correspond only to gain settings for power amplifier 336. In another embodiment, the pre-distortion curves correspond to total analog transmit path gain settings. References herein to analog transmit path gain settings therefore include both approaches. In operation, digital processor 302 selects a new total transmit path gain setting and subsequently adjusts the digital gain only if the new total transmit path gain is within a specified threshold or amount from a current analog transmit path gain setting (either the power amplifier or total transmit path according to embodiment). If not, digital processor 302 is operable to adjust the analog transmit path gain, apply a corresponding pre-distortion compensation, and adjust the digital gain if necessary. Such pre-distortion compensation, however, is preferably performed in view of a in-band signal shaping that is performed to satisfy an out of band PSD mask requirement.

FIG. 6 is an exemplary table that illustrates a mapping between specified signal shaping schemes in relation to specified channels and sub-carriers to satisfy a PSD mask according to one embodiment of the invention. As may be seen, each signal shaping scheme has a corresponding carrier/sub-carrier to which the mask can be selectively applied. The mapping defined in table 360 of FIG. 6 represents an a signal shaping scheme that is provided by either just one gain module or by a plurality of gain modules in an analog transmit path in addition to gain provided by a digital gain module.

In general, there are many implementation options. For example, in one embodiment, each modulation signal may have one or more corresponding signal shaping schemes according to a transmission type or destination. The signal shaping schemes typically will define gain/power for all frequencies whether in a single carrier or across a plurality of sub-carriers of an OFDM signal. Alternatively, for an OFDM modulation signal, each sub-carrier may have a defined signal shaping scheme.

For either approach, a signal shaping scheme may slightly reduce the power and the frequencies the farthest from a center frequency of a modulated signal or sub-carrier (e.g., 1.5-2.5 dB) or may substantially reduce the power (apply zero power) to the frequencies the farthest from the center frequency or may apply equal power to all frequencies. In the embodiments in which gain is reduced according to a signal shaping scheme, the most gain/power is applied to the center frequencies or frequencies proximate to the center frequency of the modulated signal. In one embodiment, power is merely reduced for the outer frequencies. In another embodiment, frequencies proximate to the center frequency of the channel are increased to an amount allowed to not violate a total power level restriction for the channel (including sub-carriers in an OFDM transmission).

In the embodiment of FIG. 6, it may be seen than signal shaping scheme $S_1$ or signal shaping scheme $S_2$ may be selected for either carrier $C_1$ or sub-carrier $SC_1$. Without repeating all of the information of exemplary table 360 of FIG. 6, it also be noted that three different signal shaping schemes $S_1$, $S_2$ and $S_3$ are defined for transmission for carrier $C_1$. Here, carrier $C_1$ is a carrier for a single channel. The references herein to carriers are for single channels. The signal shaping scheme may be selected, for example, based upon a selected transmission protocol or signal type for the signal of carrier C1. Similarly, signal shaping scheme $S_1$, $S_2$ and $S_5$ are defined for transmission of a common plurality of sub-carriers (here $SC_1$, $SC_2$, $SC_3$ and $SC_4$) of an OFDM modulation. Thus, it may be seen that, for a given modulated signal (whether single carrier or having a plurality of sub-carriers for an OFDM signal, for example), a plurality of signal shaping schemes may be defined and selected.

The signal shaping scheme that is selected may be selected based upon the signal type. For example, FCC restrictions prohibit transmission of signals having a frequency of less than approximately 2400 MHz. Accordingly, for channel 1 transmissions of 802.11(b) and 802.11(g) WLAN signals, signal shaping is utilized to prevent spectral regrowth in the prohibited frequency range. In one embodiment, non-symmetric signal shaping is employed in which lower frequency components are substantially reduced in gain/power for a specified modulation type that corresponds to a transmission protocol (e.g., an 802.11(b) transmission).

As another example, 802.11(a) and 802.11(g) WLAN signals are required to satisfy certain flatness requirements. Moreover, some standards have strict EVM requirements while other standards, such as 802.11(b) have much more lenient EVM requirements which can often be satisfied without the use of signal shaping schemes that reduce gain/power for specified frequencies.

Because of the channel 1 potential for 802.11(b) and 802.11(g) WLAN signals to generate spectral regrowth in FCC prohibited frequencies, one embodiment of the invention includes circuitry and/or logic to define at least one signal shaping scheme that substantially limits gain/power farthest from a center frequency of a modulated signal and closest to the prohibited frequency range. On the other hand, the signal shaping scheme does not substantially limit gain/power for frequencies of the modulated channel farthest from the prohibited frequency range and thus defines a non-symmetric signal shaping scheme. In one specific implementation, a specified signal shaping scheme defines different gain/power spectral densities for the in-phase and quadrature phase branches of a transmit signal path for specified frequencies.

FIG. 7 is a signal diagram that illustrates an exemplary mask in relation to a single channel modulated signal according to one embodiment of the invention in which equal power is applied to the entire spectrum of the modulated signal. As may be seen, mask 370 is one that corresponds to the modulated signal and only inhibits out of band signal frequencies. The signal shaping of FIG. 7 defines a flat shaped in-band response that does not slightly or substantially reduce the gain/power at the ends of the signal spectrum of the channel.

FIG. 8 is a signal diagram that illustrates an exemplary mask in relation to a plurality of sub-carriers of a modulated signal according to one embodiment of the invention in which equal gain/power is applied to the entire spectrum of the modulated signal. As may be seen, the same signal shaping of FIG. 7 is selected here wherein gain/power is not reduced for outer frequencies (those farthest from the center frequency of the modulated channel) and is applied to a plurality of sub-carriers of an OFDM modulated signal. It should be noted that the number of sub-carriers can be, for example, a large number such as 50.

Figure 9:
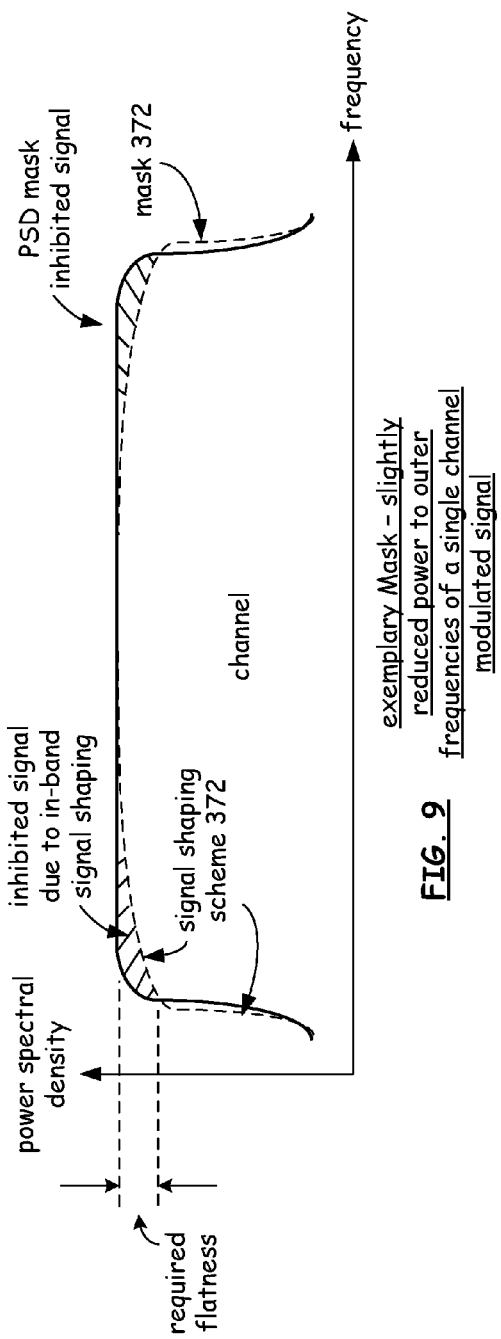
FIG. 9 is a signal diagram that illustrates an exemplary mask in relation to a single channel modulated signal according to one embodiment of the invention in which less power is applied to the frequencies farthest from the center frequency of the modulated signal and the most power is applied to the frequencies proximate to the center frequency.

FIG. 9 is a signal diagram that illustrates exemplary signal shaping in relation to a single channel modulated signal according to one embodiment of the invention in which less power is applied to the frequencies farthest from the center frequency of the modulated signal and the most power is applied to the frequencies proximate to the center frequency. More specifically, a shaped signal scheme 372 is applied to reduce the power spectral density for the frequencies farthest from a center frequency of the modulated signal. The hatched portion at both ends of the modulated in band signal spectrum reflect the inhibited signal gain/power. Stated differently, the hatched portion represents a portion of a signal power spectral density that would be present but for the selected signal shaping scheme. The reduction in the power spectral density in these regions is accomplished by either reducing gain or by selecting a filter response (or both) that reduces the power spectral density from what would have been realized without the signal shaping scheme.

Figure 10:
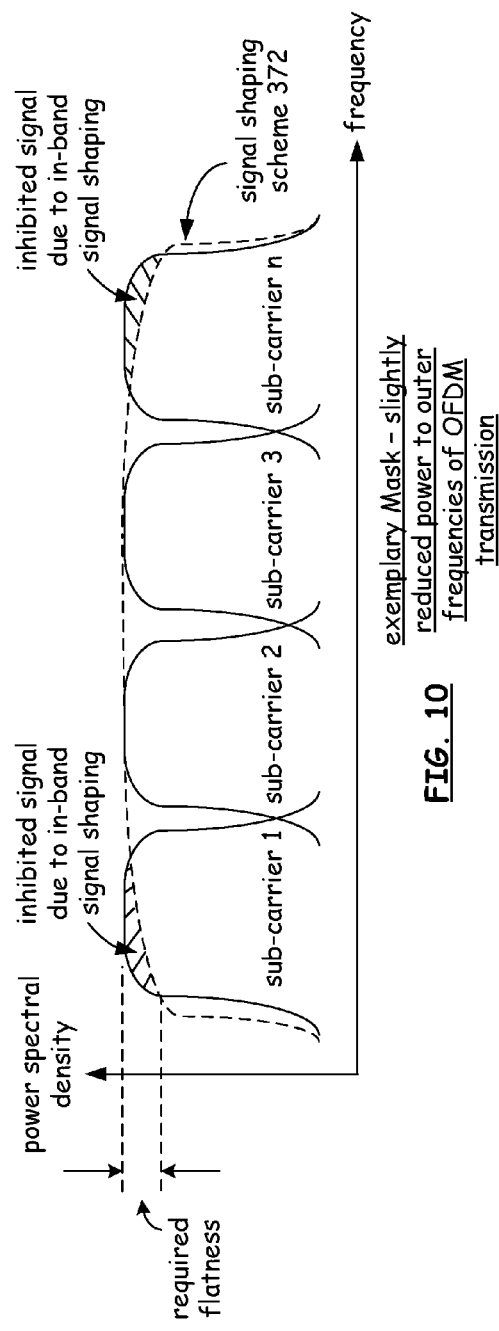
FIG. 10 is a signal diagram that illustrates an exemplary mask in relation to a plurality of sub-carriers of a modulated signal according to one embodiment of the invention in which less power is applied to the frequencies farthest from the center frequency of the modulated signal and the most power is applied to the frequencies proximate to the center frequency.

FIG. 10 is a signal diagram that illustrates exemplary signal shaping in relation to a plurality of sub-carriers of a modulated signal according to one embodiment of the invention in which less power is applied to the frequencies farthest from the center frequency of the modulated signal and the most power is applied to the frequencies proximate to the center frequency. The same mask 372 of FIG. 10 is applied here to an OFDM modulated signal having a plurality of channels (sub-carriers). As may be seen, signal shaping scheme 372 produces a similar PSD mask inhibited signal even though OFDM modulation is being used for the modulated signal.

One aspect shown in relation to FIGS. 9 and 10 is that the amount of power spectral density reduction is limited by a required PSD flatness for certain signal types. In one embodiment, the required flatness limits the variation of a signal relative to a peak value to three dB. Accordingly, for such applications, the selected signal shaping scheme only reduces the gain/power at the ends of the spectrum of the modulated signal by 1.5-2.5 dB of the peak gain/power at the center frequency of the modulated signal (whether single channel or OFDM).

FIG. 11 is a signal diagram that illustrates exemplary signal shaping in relation to a single channel modulated signal according to one embodiment of the invention in which no power is applied to the frequencies farthest from the center frequency of the modulated signal and the most power is applied to the frequencies proximate to the center frequency. FIG. 12 is a signal diagram that illustrates exemplary signal shaping in relation to a plurality of sub-carriers of a modulated signal according to one embodiment of the invention in which no gain/power is applied to the frequencies farthest from the center frequency of the modulated signal and the most power is applied to the frequencies proximate to the center frequency.

For both FIGS. 11 and 12, no flatness requirements as shown in relation to FIGS. 9 and 10 limit the amount power spectral density or gain reduction at the ends of the spectrum of the modulated signal. Accordingly, for this signal type, the gain/power for outer most frequency components are substantially reduced. In the shown embodiments of FIGS. 11 and 12, the power spectral densities are reduced to zero. In other embodiments, the power spectral densities are substantially reduced to a value above zero but below a value that would be required for required spectral flatness (e.g., within 1.5-2.5 dB of peak values).

FIG. 13 is a signal diagram that illustrates exemplary signal shaping in relation to a single channel modulated signal according to one embodiment of the invention in which no power is applied to the frequencies farthest from the center frequency of the modulated signal at one end of the modulated signal spectrum and in which the signal shaping is non-symmetric. As may be seen, signal shaping scheme 372 does not inhibit the gain/power at the high frequency end of the modulated signal spectrum while the gain/power is reduced to zero at the low frequency end of the modulated signal spectrum. In 802.11(a) and (g) applications, channel 1 signals that are adjacent to FCC limited signal frequencies for which interference or spectral regrowth should be avoided to comply with FCC restricted band requirements examples of modulated signals for which such in-band signal shaping may be applied.

FIG. 14 is a signal diagram that illustrates exemplary signal shaping in relation to a plurality of sub-carriers of a modulated signal according to one embodiment of the invention in which no power is applied to the frequencies farthest from the center frequency of the modulated signal at one end of the modulated signal spectrum and in which the PSD mask is non-symmetric. As may be seen, signal shaping scheme 372 of FIG. 13 is applied here to the OFDM modulated signal of FIG. 14 wherein on a portion of sub-carrier 1 is inhibited by the signal shaping scheme 372. Accordingly, a non-symmetric power spectral density results not only to the first sub-carrier (sub-carrier 1) of the modulated signal but also in relation to the entire modulated signal as channel 4 is not symmetrically inhibited in comparison to sub-carrier 1.

Figure 15:
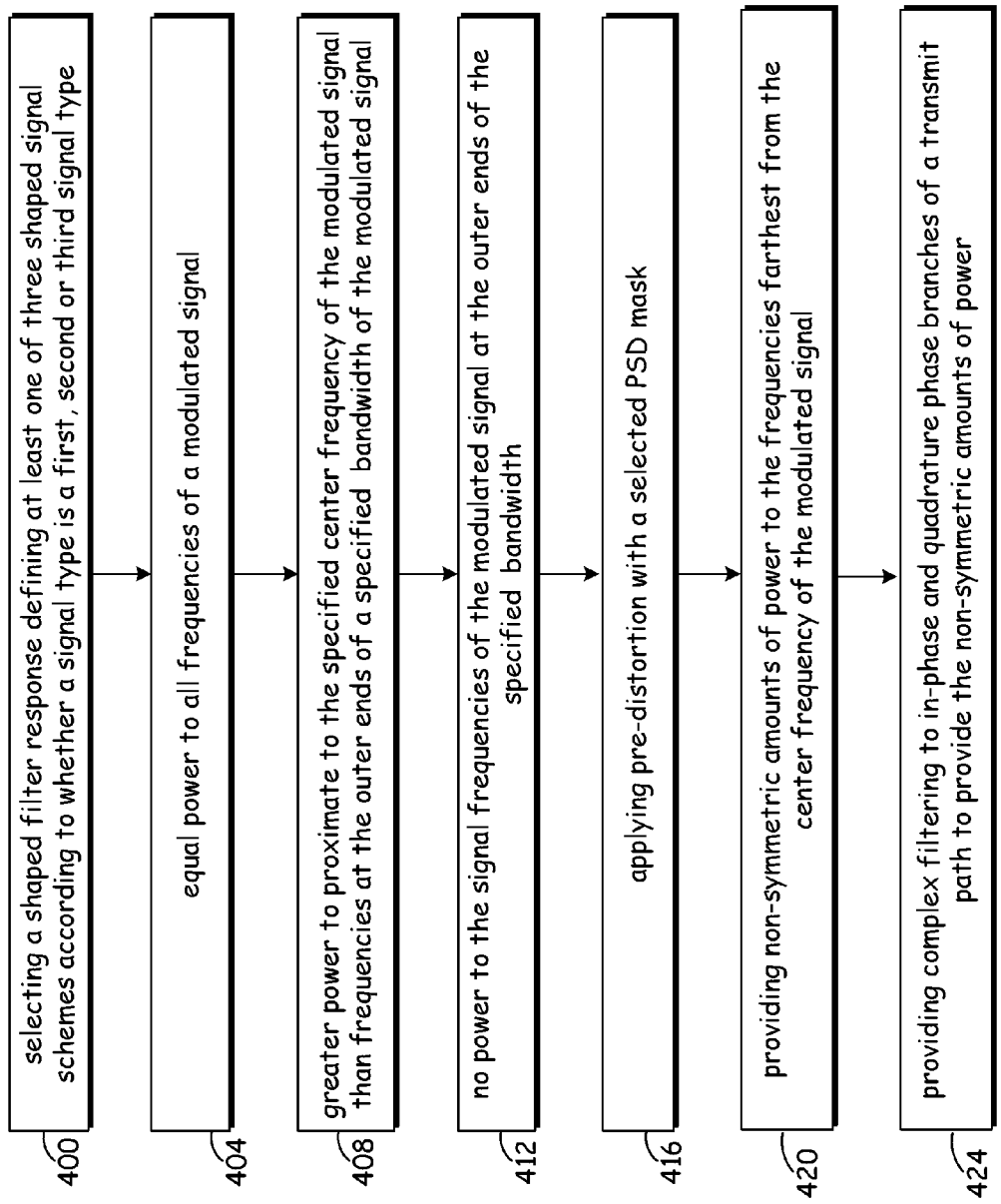
FIG. 15 is a flow chart that illustrates a method for providing desired power spectral densities according to one embodiment of the invention.

FIG. 15 is a flow chart that illustrates a method according to one embodiment of the invention. Initially, the method includes producing an outgoing digital signal and, based upon the outgoing digital signal, producing an outgoing continuous waveform radio frequency signal. As a part of producing the outgoing radio frequency signal, the method includes selecting a shaped filter response output according to one of at least three defined signal shaping schemes (step 400).

The three signal shaping schemes include equal gain/power to all frequencies of a modulated signal, greater power to proximate to the specified center frequency of the modulated signal than frequencies at the outer ends of a specified bandwidth of the modulated signal, and no power to the signal frequencies of the modulated signal to at least one end of the specified bandwidth. In the described embodiment, the signal shaping scheme is selected based at least in part upon the type of signal being transmitted and the corresponding standards or protocols for the signal type. For example, different modulation techniques have differing spectral considerations. Because higher order modulation techniques having higher data rates create non-constant envelopes and produce non-linear responses, the in band signal tends to degrade and can also be more likely to lead to out of band spectral regrowth. In general, therefore, the methods and circuitry of the embodiments of the invention provide for selecting and using signal shaping schemes to reduce or eliminate out of band spectral regrowth and for selecting and using pre-distortion compensation to correct in-band distortions caused by the non-constant envelope and non-linear circuit responses. Accordingly, three basic types of in band signal shaping schemes are implemented in one embodiment of the invention.

For a first signal type having a first data rate or modulation order, the method includes selecting a signal shaping scheme that results in a power spectral density for which there is equal power to all frequencies of the modulated signal (step 404). Stated otherwise, equal gain/power is applied across the modulated signal channel. Thus, the method includes evaluating a signal type as a part of selecting and applying a signal shaping scheme that applies equal gain/power to all frequencies.

For a second type of signal having a second data rate or modulation order, the method includes applying a first maximum allowed gain/power to the proximate center frequency of the modulated signal and applying reduced gain/power to frequencies that are a defined distance from the center frequency but still in-band of the modulated signal channel (step 408). In at least one embodiment, the reduced gain/power is within a specified amount of the second maximum allowed power. In one specific embodiment, the reduced power spectral density is within 1.5-2.5 dB of the first maximum allowed power. In other embodiments, the reduced gain/power ranges from 0 dB to this 1.5-2.5 dB down value relative to the center frequency gain/power.

For a third type of signal having a third data rate or modulation order, the method includes applying a second maximum allowed power to a proximate center frequency of the modulated signal and applying no power to frequencies that are a defined distance from the center frequency but still in-band of the modulated signal channel (step 412). For this embodiment and for any embodiment that spectral flatness requirements don't exist or are relatively lenient, power that is saved by applying no power or substantially reduced power to the outermost frequencies of the modulated signal spectrum may be added to the frequencies proximate to the center most frequency so long as the total transmitted power for the modulated signal is within the specified amount (whether specified by internal logic or communication protocol). Accordingly, the second maximum allowed power is greater than the first allowed power to the proximate center frequencies of the modulated signal.

The method of the embodiments of the present invention may therefore include applying the differing amounts of gain/power to various frequencies about a center frequency of a modulated signal by modifying the filter response and/or amplifier gain level according to whether a signal type is a first type, a second type or a third type. Additionally, the differing amounts of power may also be varied by adjusting at least one digital or analog gain to comply with the selected signal shaping scheme. Additionally, the method includes applying pre-distortion compensation that complies with the selected signal shaping scheme (step 416). For example, the pre-distortion compensation not only includes digital gain settings, but also selecting in-band frequencies to which the pre-distortion compensation is applied.

An additional aspect of the method of FIG. 15 is that non-symmetric amounts of power or power spectral densities may be achieved using a selected non-symmetric signal shaping scheme for the frequencies farthest from the center frequency of the modulated signal (step 420). In one specific embodiment, complex filtering is provided in which in-phase and quadrature phase branches of a transmit path are filtered with differing filter responses to produce the non-symmetric power spectral density response (step 424).

Figure 16:
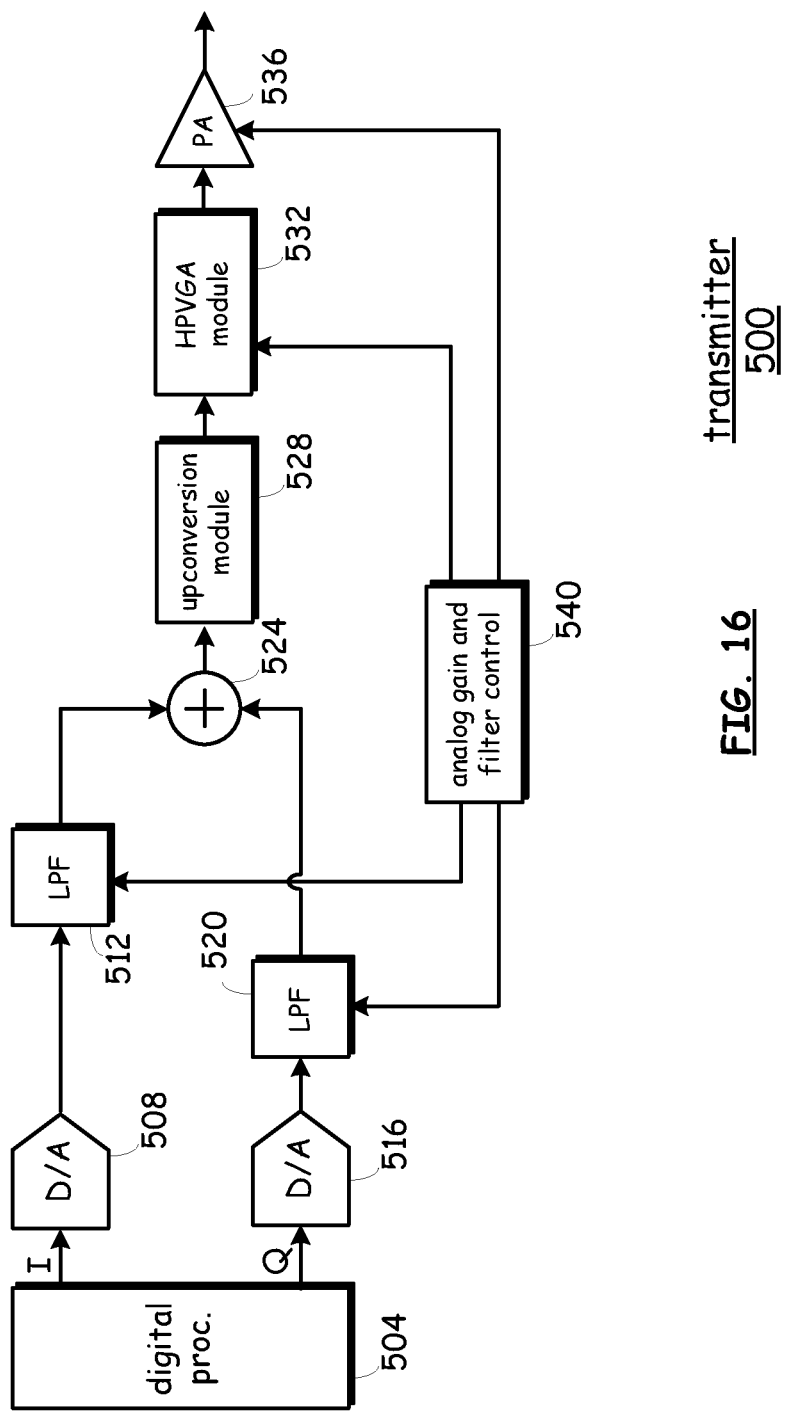
FIG. 16 is a functional block diagram of a transmitter that illustrates complex filtering to provide a desired power spectral density according to one embodiment of the invention.

FIG. 16 is a functional block diagram of an exemplary transmitter for which complex filtering is provided to create a non-symmetric signal shaping according to one embodiment of the invention. As may be seen, transmitter 500 includes a digital processor 504 that produces in-phase (I) and quadrature phase (Q) digital signal components on corresponding I and Q branches of a transmit path. The in-phase signal components are produced to a digital to analog converter 508 that produces an analog waveform signal to a low pass filter 512. The quadrature phase signal components are produced to a digital to analog converter 516 that produces an analog waveform signal to a low pass filter 520.

The outputs of filters 512 and 520 are then combined by signal adder 524 that produces a combined outgoing analog signal to up-conversion module 528. Up-conversion may be implemented in one or more up-conversion steps. An up-converted signal is then produced to a high pass variable gain amplifier module 532 which produces an amplified and high pass filtered signal to power amplifier 536 for transmission as an outgoing radio frequency signal.

One aspect of the embodiment of FIG. 16 is that transmitter 500 includes an analog gain and filter control module 540 that is operable to produce gain and filter control signals to various amplification and filtering modules of transmitter 500. Specifically, however, analog gain and filter control module 540 is operable to provide independent filter control signals to I and Q branch filters (here, filters 512 and 520) to provide differing filter responses for the I and Q branch signal components. As such, complex filtering is produced to create non-symmetric shaped signal responses. Such complex filtering may also be done digitally. If I and Q component signals are digitally filtered in a non-symmetric manner to allow symmetric processing in the analog transmit path, the I and Q component signals produced by the digital processor are different in magnitude as well as phase even if filtering in the analog transmit paths are symmetric.

It should be understood that such complex filtering may be performed in transmitters having different configurations. Thus, for example, the complex filtering illustrated in FIG. 16 may be performed for the transmitters of FIGS. 2-6 even though the separate I and Q branches are not explicitly shown Additionally, it should be noted that aspects of the methods suggested by FIGS. 6-11 may readily be implemented by any of the transmitters of FIGS. 1-5 and 16 above and 17-18 below.

Figure 17:
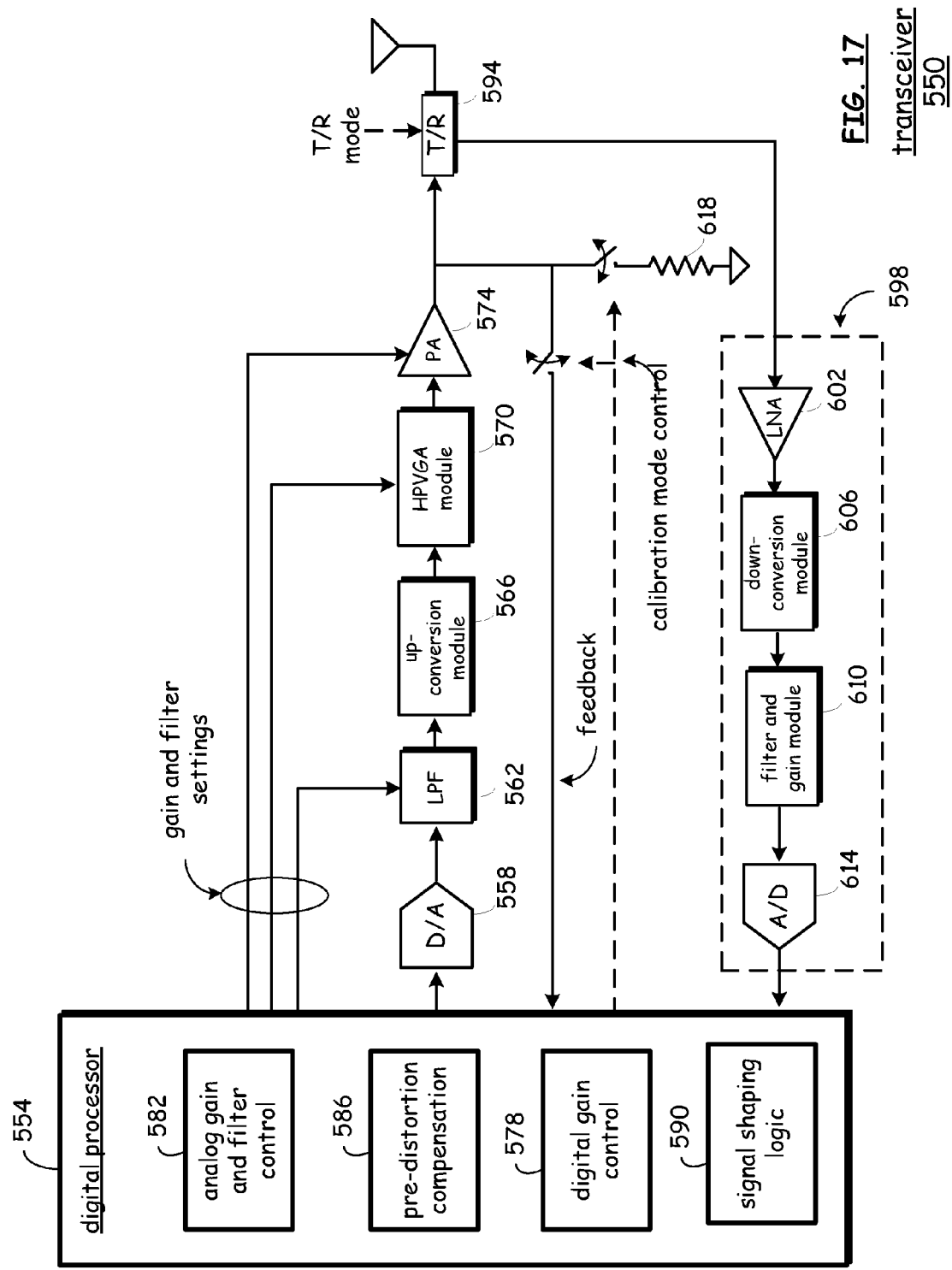
FIG. 17 is a functional block diagram of a transceiver according to one embodiment of the invention that is operable to calibrate the pre-distortion compensation signals and non-transmit modes of operation.

FIG. 17 is a functional block diagram of a transceiver according to one embodiment of the invention that is operable to calibrate the pre-distortion compensation signals and non-transmit modes of operation. As may be seen, an integrated circuit radio transceiver 550 that is operable to support wireless communications includes a digital processor 554 that produces outgoing digital data. Digital to analog conversion circuitry 558 is operable to produce analog waveform signals based upon the outgoing digital data. The analog waveform signals are conducted down radio front end transmit path circuitry including at least one low pass filter 562, an up-conversion module 566, a gain and high-pass gain module 570, and a power amplifier 574. In the described embodiment, all are coupled in series in the transmit path and are operable to collectively front end process the analog waveform signals to produce outgoing radio frequency signals.

The digital processor 554 further includes a digital control gain control module 578 to selectively apply digital gain settings and an analog gain and filter control module 582 to control power settings of the power amplifier of the transmit path circuitry to a desired total gain setting. The digital processor further includes a pre-distortion compensation module 586 to prompt the digital processor to produce a power amplifier pre-distortion digital signal superimposed on the outgoing digital data to counteract at least one of phase and amplitude distortion (in-band) introduced by the radio front end transmit path circuitry or by non-linear responses due to non-constant envelope modulation. In the described embodiment, the characteristics of the pre-distortion digital signal are based upon detected distortion that occurs in the analog transmit path. In the described embodiment, signal shaping logic 590 is operable to select a signal shape to correspond to a desired PSD mask based at least in part upon a signal type (modulation type, protocol type and/or signal data rate). Collectively, digital processor 554 produces gain and filter settings to the analog transmit path gain and filter modules to support a desired gain and power spectral density.

The transceiver 550 of FIG. 17 further includes a transmit-receive switch 594 operably disposed to couple at least one antenna to the analog transmit path output or to a receive path. In general, transmit-receive switch 594 is operably disposed to receive a transmit-receive mode indication and to perform associated switching in response to the received mode indication. When in a receive mode, switch 594 couples the antenna to receive path circuitry 598. In the embodiment shown, receive path circuitry 598 includes a low noise amplifier 602, a down-conversion module 606, a filter and gain module 610 and an analog-to-digital converter 614. In a transmit mode, the output of power amplifier 574 is coupled to the antenna by transmit-receive switch 594.

As may further be seen, the embodiment of FIG. 17 also includes a selectable feedback path operably coupling an output of the power amplifier 574 to the digital processor. The feedback path is selected whenever a calibration mode control signal is exerted to close a switch to couple the feedback line to the power amplifier 574 output. The calibration mode control signal is further operable to selectively couple a specified load device 618 (here, a 50 Ohm resistor) to the output of power amplifier 574.

In operation, when the transceiver 550 is in a calibration mode of operation (is not actually transmitting), digital processor 554 is operable to assert the calibration mode control signal to operable couple the feedback line and load device 618 to the output of power amplifier 574. As such, if power amplifier produces an outgoing RF signal while such coupling is in place, digital processor 554, more specifically, one or more of its associated modules 578-590, is operable to determine an in-band pre-distortion compensation setting. Moreover, in one embodiment, one or more of modules 578-590 are operable to determine a signal shaping scheme based in part upon the feedback received from the coupled feedback line.

Pre-distortion compensation module 586 of integrated circuit radio transceiver 550 is operable to determine a set of pre-distortion curves that define pre-distortion settings in advance for each of a plurality of specified power amplifier gain levels by coupling the specified load 618 to the transmit path (to the output of power amplifier 574) and by evaluating the feedback signal received from the feedback path for each of the power amplifier gain levels. Thereafter, feedback loop and load device 618 are decoupled to allow normal transmit and receive operations. It should the embodiment of FIG. 17 suggests half duplex communications. A diplexer may readily be used in place of transmit-receive switch 594 as part of a topology that supports full duplex communications.

Resistive load device 618, when coupled to the output of power amplifier 574, allows digital processor 554 to determine pre-distortion compensation based on a constant and real load. In an alternate embodiment, however, calibration mode control signal comprises a multi-bit signal to independently control the coupling of the feedback line and of resistive load 618. As such, pre-distortion calibration and signal shaping scheme selection may also be done based upon a feedback signal received while the power amplifier 574 is coupled to the antenna. Because the antenna provides a complex load that varies according to the environment, the calibration based upon the feedback signal may improve (though not necessarily). Moreover, because the complex load characteristics are complex and vary with the environment, such calibration may not be as constant and recalibration may need to be performed more frequently. For example, a person or object coming into close proximity to the antenna can change the characteristics of the complex load.

Figure 18:
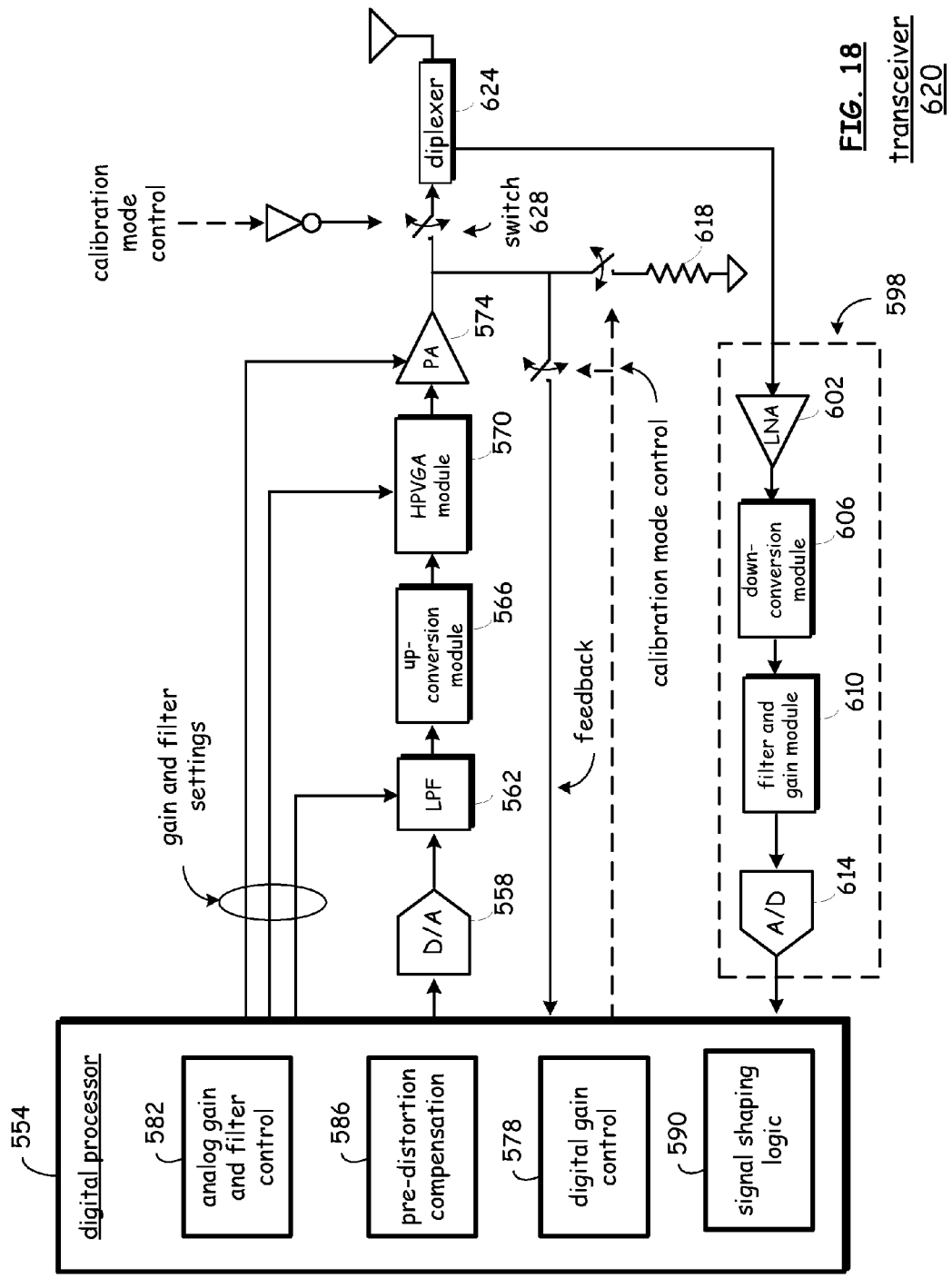
FIG. 18 is a functional block diagram of a transceiver according to one embodiment of the invention that is operable to calibrate the pre-distortion compensation signals and non-transmit modes of operation.

FIG. 18 is a functional block diagram of a transceiver according to one embodiment of the invention that is operable to calibrate the pre-distortion compensation signals and non-transmit modes of operation. As may be seen, the circuitry of FIG. 18 is similar to FIG. 17. Accordingly, the common components and operation won't be repeated here.

FIG. 18 is a functional block diagram of a full duplex transceiver 650 that operates according to one embodiment of the invention. Commonly numbered elements of FIG. 18 with FIG. 17 are similar. In addition to the common elements, the embodiment of FIG. 18 includes a diplexer 624 in place of transmit-receive switch 594 of FIG. 17. As may further be seen, a switch 628 is operable to couple the output of power amplifier 574 to diplexer 624 based upon the calibration mode control signal.

In operation, the calibration mode control signal is inverted prior to being applied to switch 628. Accordingly, switch 628 opens a connection when the feedback loop and resistive load device 618 are coupled to the output of power amplifier 574 to prevent the amplified output from being radiated by the antenna. Conversely, when the resistive load 618 and the feedback loop are decoupled based upon the calibration mode control signal, switch 628 couples the output of power amplifier 574 to diplexer 624. Here, in one embodiment, the calibration mode control signal is a single bit signal that prompts the switching as described. In an alternate embodiment, the calibration mode control signal comprises a 2 bit signal to allow independent selection of the coupling of the feedback loop in relation to the coupling of load 618 and diplexer 624 (wherein the diplexer is only coupled when load 618 is not coupled to the output of power amplifier 574).

Figure 19:
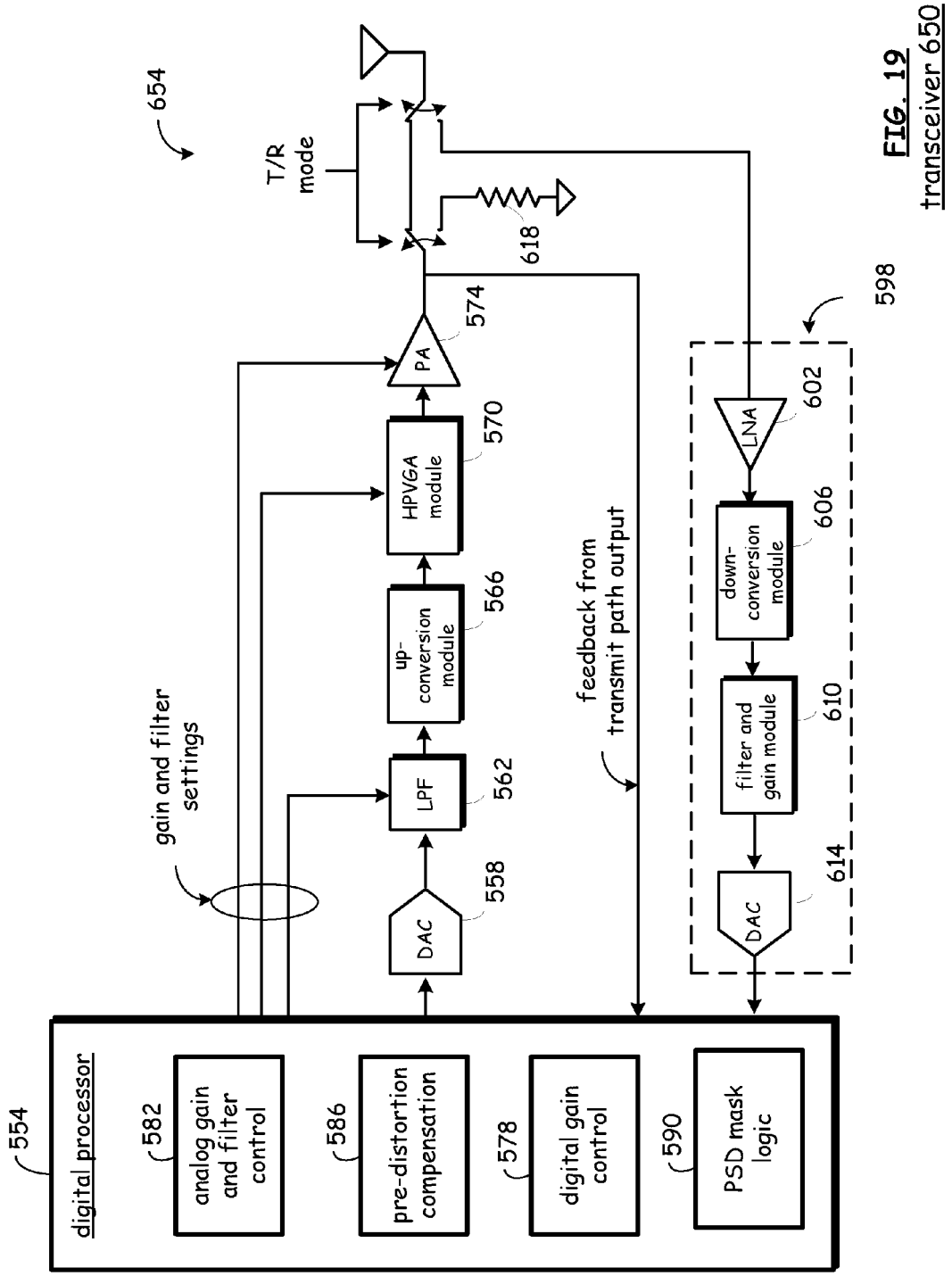
FIG. 19 is a functional block diagram of a transceiver 650 that operates according to one embodiment of the invention.

FIG. 19 is a functional block diagram of a transceiver 650 that operates according to one embodiment of the invention. Commonly numbered elements of FIG. 19 with FIGS. 17 and 18 are similar. In addition to the common elements, the embodiment of FIG. 19 includes a transmit receive module 654 that is operable to couple load 618 to the output of power amplifier 574 at the same time that receive path 598 is coupled to the antenna for receive operations based upon a received transmit-receive mode indication. Subsequently, load 618 is decoupled from the output of power amplifier 574 whenever receive path 598 is decoupled from the antenna. Additionally, as may be seen, a feedback path is continuously coupled to the output of power amplifier 574 to operably couple digital processor 554 to the output of power amplifier 574.

One aspect of the transceiver 650 in relation to transceiver 550 of FIG. 17 is that transceiver 650 is operable to receive feedback while load device 618 is operably coupled during receive operations and also while a reactive load with complex impedance is coupled to the power amplifier output 574 during transmit operations. Accordingly, pre-distortion compensation module 586 is operable to adjust at least one of the pre-distortion signals determined in advance based upon a feedback signal that is received while the antenna is operably coupled to the transmit path output. In one specific embodiment, module 586 (or other logic within digital processor 554) measures a voltage standing wave ratio of the feedback signal to determine whether to adjust the at least one pre-distortion signal or as a part of determining how to adjust the at least one pre-distortion signal.

As another aspect of the embodiment of the invention, the pre-distortion compensation module 586 restores the pre-distortion signal that was determined in advance for the at least one pre-distortion signal if the feedback signal includes a performance indication that is higher using the pre-distortion signal determined in advance in relation to the pre-distortion signal determined while the antenna was operably coupled to the transmit path output. Additionally, the pre-distortion compensation module 586 is operable to determine a power spectral density mask to use while the antenna is coupled based upon the feedback signal that was received while the specified load was coupled to the transmit path output. In one alternate embodiment, the load 618 comprises a real component from a resistive element in addition to a complex component to simulate a typical antenna impedance to facilitate the determination of more accurate pre-distortion compensation settings in advance of normal operations.

Finally, in one embodiment, the integrated circuit radio transceiver is a MIMO transceiver operable to support OFDM modulation wherein the pre-distortion signals are determined for each of the transmit paths of the MIMO transceiver. Thus, a corresponding plurality of feedback paths are operably created to support determining and optimizing pre-distortion settings and/or PSD mask selection.

Figure 20:
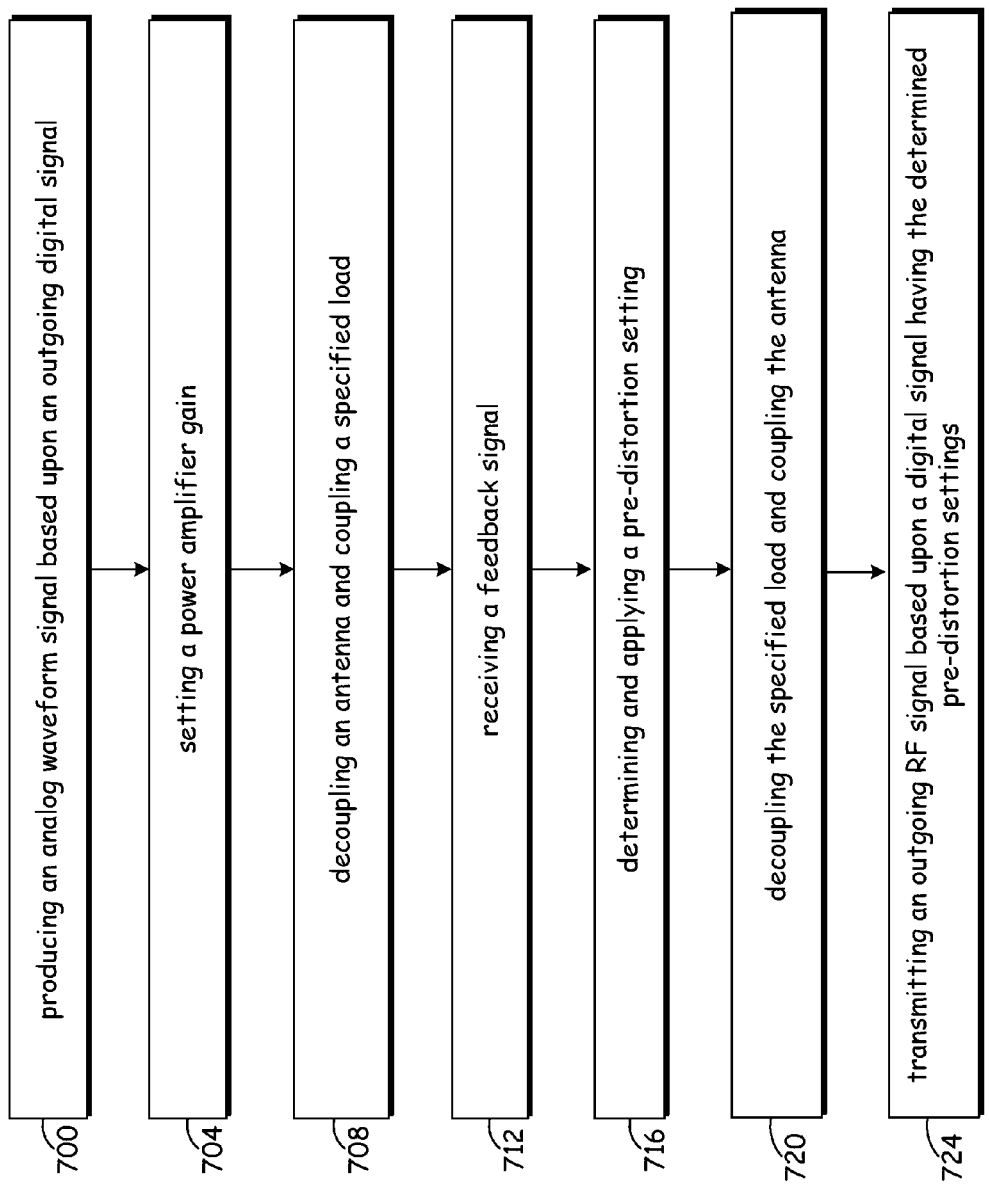
FIG. 20 is a flow chart of a method according to one embodiment of the invention.

FIG. 20 is a flow chart of a method according to one embodiment of the invention. The method includes, in an integrated circuit radio transceiver for producing an outgoing radio frequency signal, producing an outgoing digital signal, and producing an analog waveform signal based upon the outgoing digital signal (step 700). Thereafter, the method includes setting a power amplifier gain (step 704) and decoupling an antenna and coupling a specified load (step 708). In one embodiment, the load is a 50 Ohm resistive load. In another embodiment, the load has complex components. Thereafter the method includes receiving a feedback signal (step 712) and determining and applying a pre-distortion setting based upon the feedback signal with a specified load coupled to the power amplifier while the antenna is switched out (step 716). In one particular embodiment, the method includes applying an initial pre-distortion setting prior to applying the pre-distortion setting based upon the feedback signal. Thereafter, the method includes switching out the specified load and coupling an antenna for radiating the outgoing radio frequency signal. The method thereafter includes decoupling the specified load and coupling the antenna (step 720) and transmitting an outgoing RF signal based on a digital signal having the determined pre-distortion settings (step 724).

Figure 21:
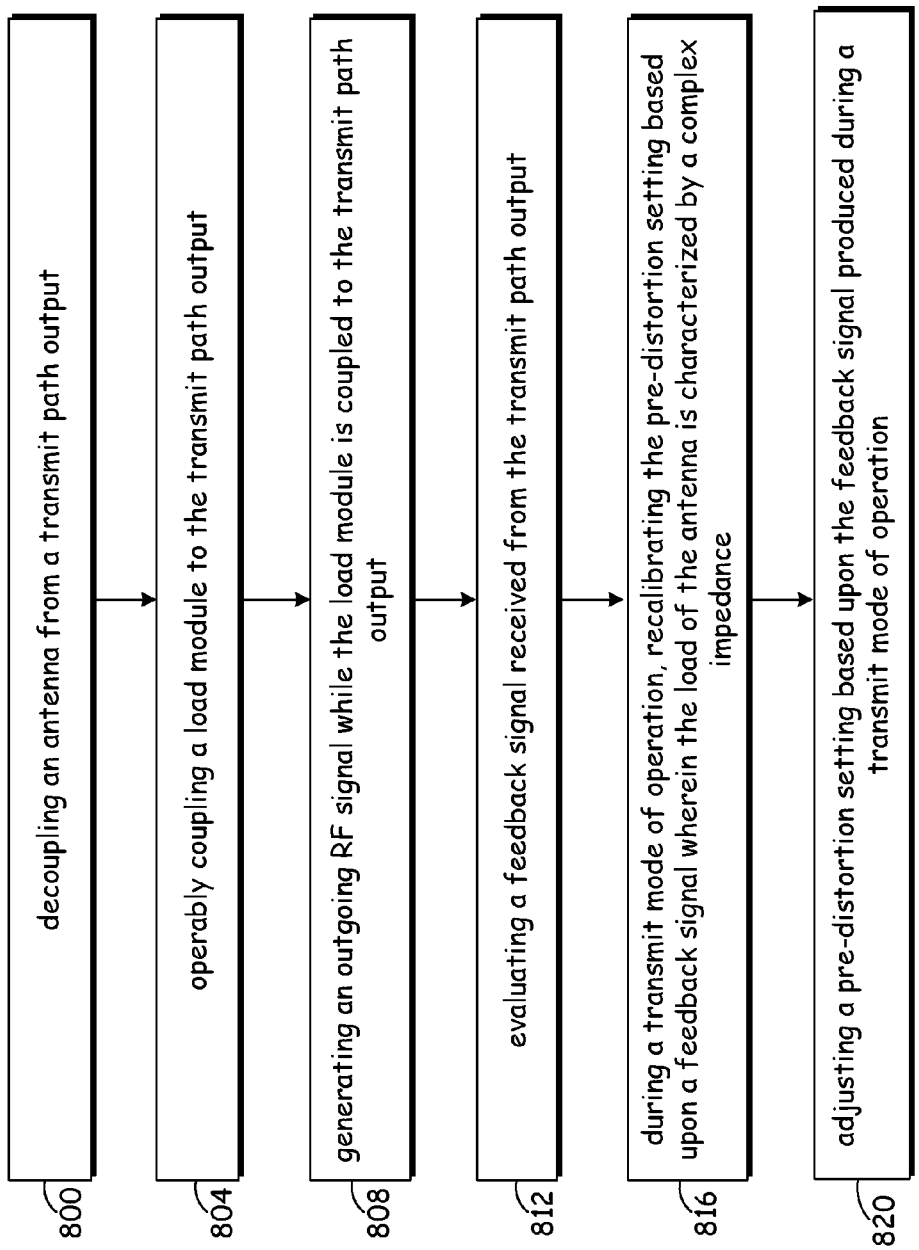
FIG. 21 is a flow chart of a method according to one embodiment of the invention.

FIG. 21 is a flow chart illustrating method according to one embodiment of the invention. The method initially includes decoupling an antenna from a transmit path output (step 800) and operably coupling a load module to the transmit path output (step 804). Thereafter, the method includes generating an outgoing RF signal while the load module is coupled to the transmit path output (step 808) and evaluating a feedback signal received from the transmit path output (step 812). The method further includes recalibrating the pre-distortion setting based upon the feedback signal wherein the load of the antenna is characterized by a complex impedance (step 816). Finally, the method includes adjusting a pre-distortion setting based upon the feedback signal produced during a transmit mode of operation. (step 820).

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences.

As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled".

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

The invention claimed is:

1. A method of operating an integrated circuit radio transceiver to produce an outgoing Radio Frequency (RF) signal comprising:
   selecting a pre-distortion setting from a plurality of pre-determined pre-distortion settings;
   producing an outgoing digital signal using outgoing data and the pre-distortion setting;
   producing the RF signal based upon the outgoing digital signal;
   amplifying the RF signal by a power amplifier;
   coupling a specified load to the power amplifier output;
   enabling a receive path;
   coupling the receive path to the power amplifier output;
   receiving the RF frequency signal via the receive path, the receive path different from a feedback path that carries the feedback signal;
   determining the plurality of pre-determined pre-distortion settings using the receive path;
   measuring a voltage standing wave ratio of a feedback signal produced at the power amplifier output;
   selecting a different pre-distortion setting from the plurality of pre-determined pre-distortion settings based upon the voltage standing wave ratio; and
   decoupling the specified load and coupling an antenna to the power amplifier output to radiate the RF signal.

2. The method of claim 1, wherein the specified load is a 50 ohm load.

3. The method of claim 1, further comprising, during a transmit mode of operation with the antenna coupled to the power amplifier output to radiate the RF signal, altering the pre-distortion settings based upon the feedback signal.

4. The method of claim 1, further comprising adjusting a gain setting of one of a filter, a mixer, and a signal amplifier in a transmit path corresponding to the pre-distortion setting.

5. The method of claim 1, wherein:
   the transceiver is operable to support OFDM modulation; and
   the pre-distortion settings are determined based upon OFDM modulation parameters.

6. The method of claim 1, wherein:
   the transceiver is a MIMO transceiver and includes multiple transmit paths; and
   pre-distortion settings are determined for the multiple transmit paths.

7. The method of claim 1 further comprising determining a plurality of power spectral density masks to employ as the plurality of pre-determined pre-distortion settings.

8. The method of claim 1, further comprising:
   adjusting at least one analog transmit path gain setting; and
   for each gain setting, determining a pre-distortion setting for selection during a transmit mode of operation.

9. The method of claim 1, wherein the RF signal is one of a Wireless Local Area Network (WLAN) signal and a cellular network signal.

10. An integrated circuit radio transceiver operable to support wireless communications, comprising:
    processing circuitry operable to:
      select a pre-distortion setting from a plurality of pre-determined settings; and
      produce an outgoing digital signal using the pre-distortion setting;
    analog transmit path circuitry including up-conversion circuitry and a power amplifier and operable to produce a Radio Frequency (RF) signal based upon the outgoing digital signal;
    a feedback path coupled between the power amplifier output and the processing circuitry;
    coupling circuitry operable to couple an antenna to the power amplifier output during transmit operations and to couple a specified load to the power amplifier output during calibration operations;
    wherein during calibration operations, the processing circuitry is operable to:
      measure a voltage standing wave ratio of a feedback signal produced at the power amplifier output via a feedback path;
      receive the RF signal via the receive path, the receive path different than the feedback path; and
      determine the plurality of pre-determined pre-distortion settings using the receive path; and
      select a different pre-distortion setting from the plurality of pre-determined pre-distortion settings based upon the voltage standing wave ratio.

11. The integrated circuitry radio transceiver of claim 10, wherein the specified load is a 50 ohm load.

12. The integrated circuitry radio transceiver of claim 10, wherein the processing circuitry is further operable to, during transmit operation, alter the pre-distortion settings based upon the feedback signal.

13. The integrated circuitry radio transceiver of claim 10, wherein the processing circuitry is further operable to adjust a gain setting of at least one component of the transmit path corresponding to the pre-distortion setting.

14. The integrated circuitry radio transceiver of claim 10, wherein:
    the transceiver is operable to support OFDM modulation; and
    the pre-distortion settings are determined based upon OFDM parameters.

15. The integrated circuitry radio transceiver of claim 10, wherein:
    the transceiver is a MIMO transceiver and includes multiple transmit paths; and
    the pre-distortion settings are determined for each of the multiple transmit paths.

16. The integrated circuitry radio transceiver of claim 10, wherein the processing circuitry is further operable to determine a plurality of power spectral density masks to employ as the plurality of pre-determined pre-distortion settings.

17. The integrated circuitry radio transceiver of claim 10, wherein the processing circuitry is further operable to:
   adjust at least one analog transmit path gain setting; and
   for each gain setting, determine a pre-distortion setting for selection during transmit mode of operations.

18. The integrated circuit radio transceiver of claim 10, wherein the RF signal is one of a Wireless Local Area Network (WLAN) signal and a cellular network signal.

19. An integrated circuit radio transceiver operable to support wireless communications, comprising:
   processing circuitry operable to produce an outgoing digital signal:
   analog transmit path circuitry including up-conversion circuitry and a power amplifier and operable to produce a Radio Frequency (RF) signal based upon the outgoing digital signal;
   a receive path;
   a feedback path coupled between the power amplifier output and the processing circuitry;
   coupling circuitry operable to couple an antenna to the power amplifier output during transmit operations and to couple a specified load to the power amplifier output during calibration operations;
   wherein during calibration operations, the processing circuitry is operable to:
      receive the RF signal via the receive path, the receive path different than the feedback path; and
      determine a plurality of pre-determined pre-distortion settings using the receive path; and
      select one of the plurality of pre-determined pre-distortion setting based upon a feedback signal received via the feedback path.

20. The integrated circuitry radio transceiver of claim 19, wherein the processing circuitry is further operable to, during transmit operation, alter the pre-distortion settings based upon the feedback signal.

* * * * *